United States Patent
Shino

(10) Patent No.: US 7,629,648 B2
(45) Date of Patent: Dec. 8, 2009

(54) SEMICONDUCTOR MEMORY DEVICE AND MANUFACTURING METHOD THEREOF

(75) Inventor: Tomoaki Shino, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 206 days.

(21) Appl. No.: 11/616,124

(22) Filed: Dec. 26, 2006

(65) Prior Publication Data

US 2007/0187742 A1 Aug. 16, 2007

(30) Foreign Application Priority Data

Feb. 15, 2006 (JP) ............... 2006-038442

(51) Int. Cl.
  *H01L 29/76* (2006.01)
  *H01L 27/01* (2006.01)
(52) U.S. Cl. ............. 257/344; 257/347; 257/368; 257/E29.255
(58) Field of Classification Search ........ 257/288, 257/344, 347, 368, E29.255
  See application file for complete search history.

(56) References Cited

U.S. PATENT DOCUMENTS

| | | | |
|---|---|---|---|
| 6,197,636 B1 * | 3/2001 | Park et al. | 438/257 |
| 6,946,377 B2 * | 9/2005 | Chambers | 438/588 |
| 2003/0025135 A1 * | 2/2003 | Matsumoto et al. | 257/288 |
| 2005/0133843 A1 | 6/2005 | Shino | |
| 2006/0049444 A1 | 3/2006 | Shino | |
| 2008/0061326 A1 * | 3/2008 | Yoshida et al. | 257/288 |

FOREIGN PATENT DOCUMENTS

| JP | 2005-158869 | 6/2005 |
|---|---|---|
| JP | 2006-80280 | 3/2006 |

* cited by examiner

*Primary Examiner*—Tuan N. Quach
(74) *Attorney, Agent, or Firm*—Oblon, Spivak, McClelland, Maier & Neustadt, L.L.P.

(57) ABSTRACT

The disclosure concerns a semiconductor memory device including an insulating film; a semiconductor layer provided on the insulating film; a source layer and a drain layer formed on the semiconductor layer; a body region provided between the source layer and the drain layer, the body region being in an electrically floating state, accumulating or emitting charges for storing data, and including a first body part and a second body part, the first body part being smaller than the second body part in a thickness measured in a direction perpendicular to a surface of the insulating film; a gate insulating film provided on the first body part and the second body part; and a gate electrode provided on the gate insulating film.

14 Claims, 47 Drawing Sheets

FIRST EMBODIMENT

MEMORY REGION

LOGIC CIRCUIT REGION

MEMORY REGION

LOGIC CIRCUIT REGION

MEMORY REGION

LOGIC CIRCUIT REGION

MEMORY REGION

LOGIC CIRCUIT REGION

MEMORY REGION

LOGIC CIRCUIT REGION

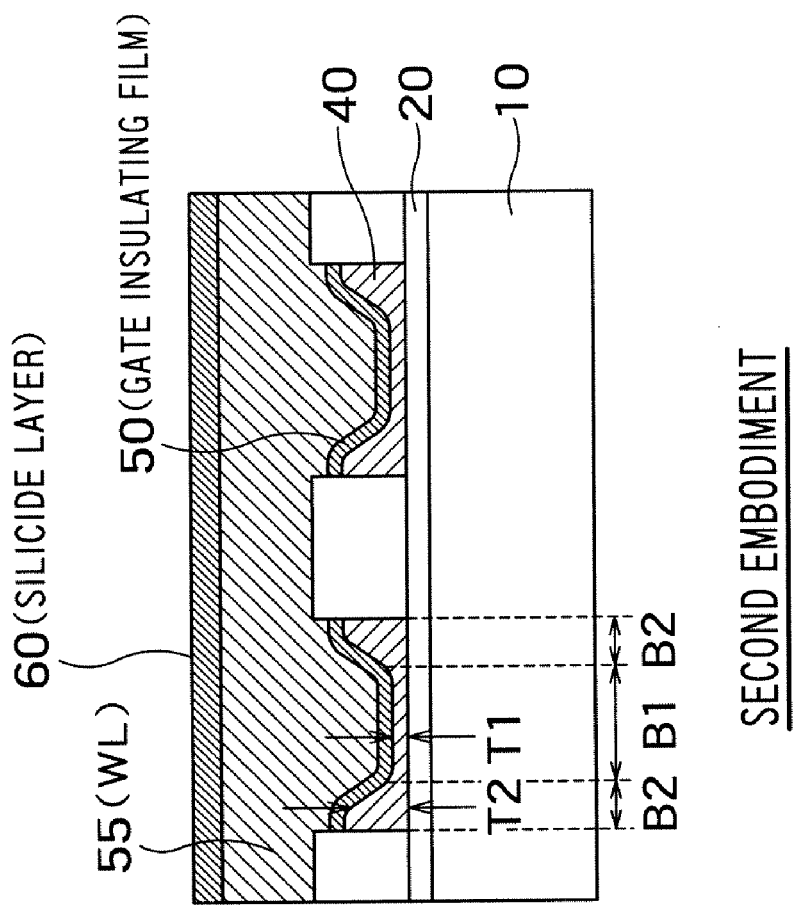
FIG. 11  SECOND EMBODIMENT

MEMORY REGION

LOGIC CIRCUIT REGION

MEMORY REGION

LOGIC CIRCUIT REGION

THIRD EMBODIMENT

MEMORY REGION

LOGIC CIRCUIT REGION

MEMORY REGION

LOGIC CIRCUIT REGION

MEMORY REGION

LOGIC CIRCUIT REGION
FOURTH EMBODIMENT

MEMORY REGION

LOGIC CIRCUIT REGION

MEMORY REGION

MEMORY REGION

MEMORY REGION

MEMORY REGION

MEMORY REGION

MEMORY REGION

MEMORY REGION

MEMORY REGION

MEMORY REGION

MEMORY REGION

MEMORY REGION

LOGIC CIRCUIT REGION

MEMORY REGION

LOGIC CIRCUIT REGION

MEMORY REGION

LOGIC CIRCUIT REGION

MEMORY REGION

LOGIC CIRCUIT REGION

MEMORY REGION

LOGIC CIRCUIT REGION

MEMORY REGION

LOGIC CIRCUIT REGION

MEMORY REGION

LOGIC CIRCUIT REGION

MEMORY REGION

MEMORY REGION

MEMORY REGION

MEMORY REGION

SEMICONDUCTOR MEMORY DEVICE AND MANUFACTURING METHOD THEREOF

CROSS-REFERENCE TO RELATED APPLICATION

This application is based upon and claims the benefit of priority from the prior Japanese Patent Applications No. 2006-38442, filed on Feb. 15, 2006, the entire contents of which are incorporated herein by reference.

BACKGROUND OF THE INVENTION

1. Field of the Invention

The present invention relates to a semiconductor memory device and manufacturing method thereof.

2. Related Art

A floating body cell (FBC) memory device is superior in size reduction to a 1-transistor-1-capacitor (1T-1C) dynamic random-access memory (DRAM) device. Therefore, attention has been paid to the FBC memory device as a semiconductor memory device to replace the conventional 1T-1C DRAM device.

A memory cell of the FBC memory device (hereinafter, "FBC" or "memory cell") normally consist of a MISFET formed on an SOI substrate. In an FBC, a source region, a drain region, and a body region are formed on an SOI layer. The body region put between the source region and the drain region is in an electrically floating state.

A drain current is changed according to the number of holes accumulated in the body region. It is possible to discriminate data "1" from data "0" according to a change amount of the drain current. For instance, data is discriminated as "1" when the number of holes in the body region is large, and data is discriminated as "0" when the number of holes in the body region is small. In such an FBC, if the SOI layer on which the body region is formed is made thinner, the difference in amount of signal between the data "0" and the data "1" normally becomes greater.

However, if the SOI layer is thinner, the source and drain regions are thinner, accordingly. This disadvantageously narrows a contact area between a silicide layer and the source or drain, and increases a contact resistance therebetween. For these reasons, it is disadvantageously difficult to set the difference in amount of signal between the data "0" and the data "1" sufficiently great in the conventional FBC.

SUMMARY OF THE INVENTION

A semiconductor memory device according to an embodiment of the present invention comprises an insulating film; a semiconductor layer provided on the insulating film; a source layer and a drain layer formed on the semiconductor layer; a body region provided between the source layer and the drain layer, the body region being in an electrically floating state, accumulating or emitting charges for storing data, and including a first body part and a second body part, the first body part being smaller than the second body part in a thickness measured in a direction perpendicular to a surface of the insulating film; a gate insulating film provided on the first body part and the second body part; and a gate electrode provided on the gate insulating film.

A semiconductor memory device according to an embodiment of the present invention comprises an insulating film; a semiconductor layer provided on the insulating film; a source layer and a drain layer formed on the semiconductor layer; a body region provided between the source layer and the drain layer, the body region being in an electrically floating state, accumulating or emitting charges for storing data, and including a first body part and a second body part, the first body part and the second body part differing in width between the source layer and the drain layer; a gate insulating film provided on the first body part and the second body part; and a gate electrode provided on the gate insulating film.

A manufacturing method of a semiconductor memory device according to an embodiment of the present invention, the semiconductor memory device including a body region provided between a drain layer and a source layer in an electrically floating state, the body region including a first body part and a second body part, the semiconductor memory device storing data according to a quantity of charges accumulated in the body region, the method comprises preparing a substrate including a semiconductor layer provided on an insulating film; forming a first mask material on an element formation region of the semiconductor layer; removing the semiconductor layer of element isolation regions by using the first mask material as a mask; forming element isolations by filling the element isolation regions with an element isolation material; forming a second mask material covering the second body part of the body region between the element isolations; reducing a thickness of the first body part by using the second mask material as a mask, so that the first body part is smaller than the second body part in a thickness measured in a direction perpendicular to a surface of the insulating film.

A manufacturing method of a semiconductor memory device according to an embodiment of the present invention, the semiconductor memory device including a body region provided between a drain layer and a source layer in an electrically floating state, the body region including a first body part and a second body part, the drain layer including a first drain part and a second drain part, the source layer including a first source part and a second source part, the semiconductor memory device storing data according to a quantity of charges accumulated in the body region, the method comprises preparing a substrate including a semiconductor layer provided on an insulating film; forming a first mask material on an element formation region of the semiconductor layer; anisotropically etching the semiconductor layer of element isolation regions by using the first mask material as a mask; forming element isolations by filling the element isolation regions with an element isolation material; forming a second mask material covering the second body part, the second source part and the second drain part between the element isolations; forming a gate insulating film on the first body part; forming a gate electrode on the gate insulating film, the gate electrode extending in a perpendicular direction to an extension direction of the second mask material; implanting impurities into the semiconductor layer using the second mask material as the mask, and forming the first source part and the first drain part; removing the second mask material; depositing a sidewall film; leaving the sidewall film on a side surface of the gate electrode by anisotropically etching the sidewall film; and implanting the impurities into the semiconductor layer using the sidewall film as the mask, and forming the second source part and the second drain part.

BRIEF DESCRIPTION OF THE DRAWINGS

FIG. 11 is a cross-sectional view of an FBC memory device according to a second embodiment;

DETAILED DESCRIPTION OF THE INVENTION

Hereafter, embodiments of the present invention will be described with reference to the drawings. Note that the invention is not limited to the embodiments.

First Embodiment

Figure 1:
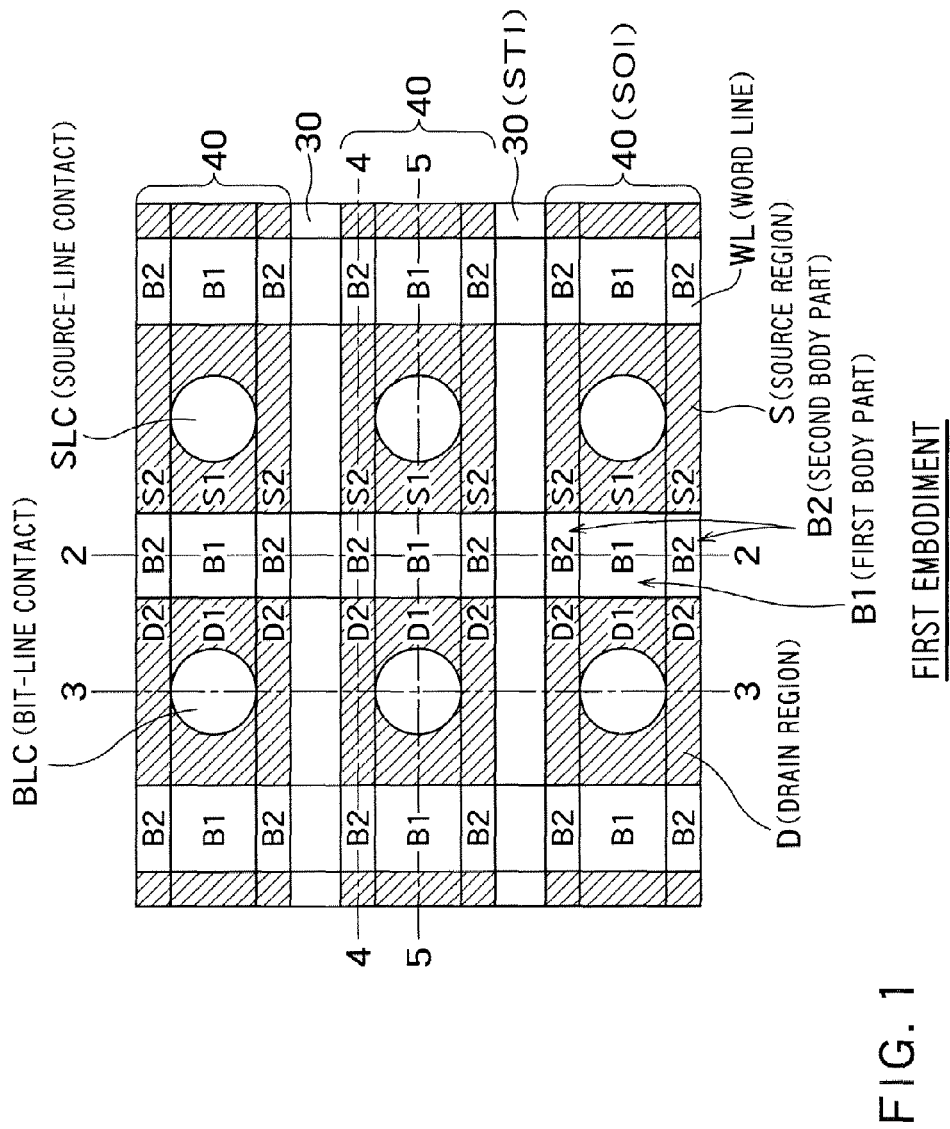
FIG. 1 is a plan view of an FBC memory device according to a first embodiment.

FIG. 1 is a plan view of an FBC memory device according to a first embodiment of the present invention. A plan view of a memory region of the FBC memory device is shown in FIG. 1. A logic circuit for controlling the memory region is not shown in FIG. 1 because the logic circuit may be the same in configuration as a conventional logic circuit region.

The FBC memory device is formed on an SOI substrate. In the memory region, shallow trench isolation (STI) regions 30 serving as element isolation regions extend in a line shape. An SOI layer 40 is formed between adjacent STI regions 30. Therefore, line-shaped SOI layers 40 extend in parallel to the line-shaped STI regions 30. A source layer S, a drain layer D, and a body region are formed in the SOI layer 40.

A source-line contact SLC is provided on the source layer S, and a bit-line contact BLC is provided on the drain layer D. Word lines WL (also referred to as "gate electrodes") are provided in a direction orthogonal to an extension direction of the SOI layers 40.

The SOI layer 40 below each world line WL serves as the body region. The body region includes a first body part B1 and a second body part B2. The body region is located between the source layer S and the drain layer D. The source layer S includes a first source part S1 and a second source part S2. The drain layer D includes a first drain part D1 and a second drain part D2.

Figure 2:
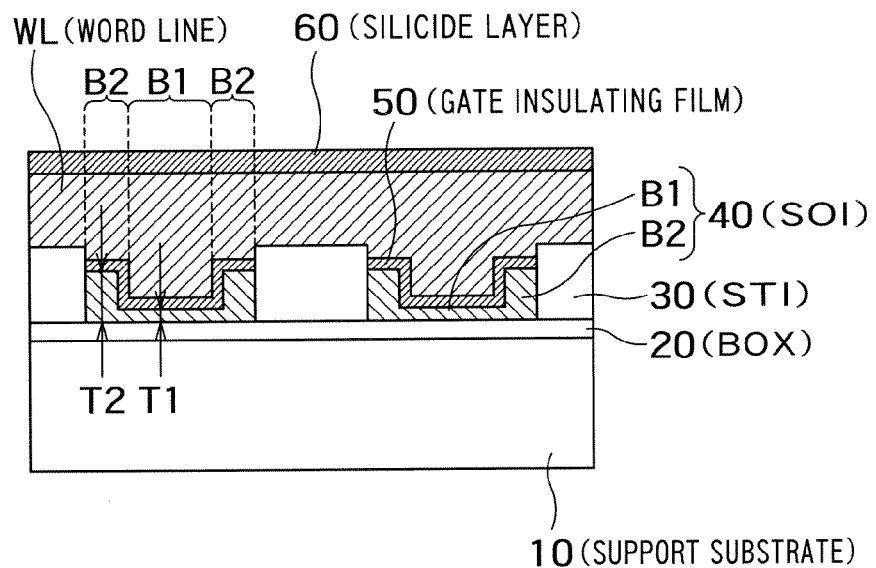
FIG. 2 is a cross-sectional view of the FBC memory device taken along a line 2-2 of FIG. 1.

FIG. 2 is a cross-sectional view of the FBC memory device taken along a line 2-2 of FIG. 1. The line 2-2 is a line in an extension direction of the word line WL, that is, a line extending in a channel width direction of a memory cell. As can be seen from FIG. 2, the FBC memory device according to the present embodiment includes a support substrate 10, a buried oxide (BOX) layer 20 serving as an insulating film, the STI region 30 serving as an element isolation region, an SOI region 40 serving as a semiconductor region, a gate insulating film 50, the word line WL serving as a gate electrode, and a silicide layer 60.

The support substrate 10 is made of a semiconductor material such as silicon. The BOX layer 20 is provided on the support substrate 10 and is, for example, a silicon oxide film. The SOI layer 40 is provided on the BOX layer 20 and is made of, for example, single-crystalline silicon.

The body region formed in the SOI layer 40 is provided between the drain layer D and the source layer S, and is in an electrically floating state. The FBC can accumulate and emit charges in and from the body region, and store therein binary data according to a quantity of charges accumulated in the body region.

As shown in FIG. 2, in the body region, the first body part B1 differs in thickness from the second body part B2. A thickness T1 of the first body part B1 is smaller than a thickness T2 of the second body part B2. In the present embodiment, the second body part B2 is adjacent to the STI region 30, and the first body part B1 is put between a pair of adjacent second body parts B2.

The gate insulating film 50 is provided on the first and second body parts B1 and B2, and may be, for example, a silicon oxide film, a silicon nitride film, a silicon oxynitride film or a hafnium silicate film. The word line WL is provided on the gate insulating film 50, and is made of, for example, polysilicon or silicide. The silicide layer 60 is provided on the word line WL to reduce a gate resistance.

Figure 3:
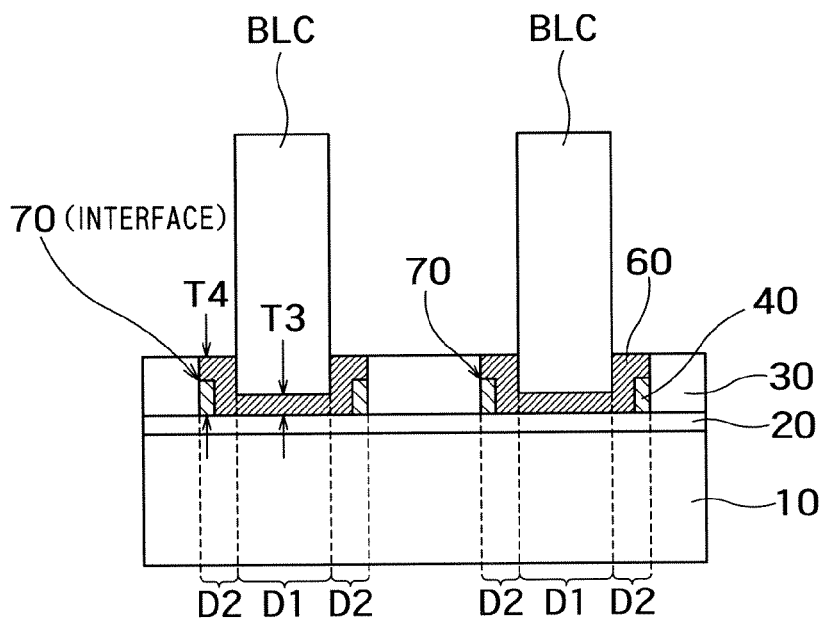
FIG. 3 is a cross-sectional view of the FBC memory device taken along a line 3-3 of FIG. 1.

FIG. 3 is a cross-sectional view of the FBC memory device taken along a line 3-3 of FIG. 1. The line 3-3 is a line parallel to the line 2-2 and on the BLCs. Therefore, FIG. 3 shows a cross section of the BLCs and the drain layers D.

In the cross-sectional view of FIG. 3, the drain layer D is provided in the SOI layer 40. In the drain layer D, the first drain part D1 differs in thickness from the second drain part D2. A thickness T3 of the first drain part D1 is smaller than a thickness T4 of the second drain part D2. The first drain part D1 is made of the silicide layer 60 formed on the BOX layer 20. The second drain part D2 is made of a multilayer film. The multilayer film includes the SOI layer 40 on the BOX layer 20 and the silicide layer 60 formed on the SOI layer 40. The bit-line contact BLC is provided on the first drain part D1, and is electrically connected to the drain layer D.

A cross-sectional structure of the source layer S is not shown in any figures because the structure is the same as that of the drain layer D. The source layer S includes the first source part S1 and the second source part S2 different in thickness in a cross section in the channel width direction. The thickness is measured in a direction perpendicular to a surface of the BOX layer 20. The first source part S1 is thinner than the second source part S2. The first source part S1 is made of the silicide layer 60 formed on the BOX layer 20. The second source part S2 is made of a multilayer film. The multilayer film includes the SOI layer 40 on the BOX layer 20 and the silicide layer 60 formed on the SOI layer 40. The source-line contact SLC is provided on the first source part S1, and is electrically connected to the source layer S.

Figure 4:
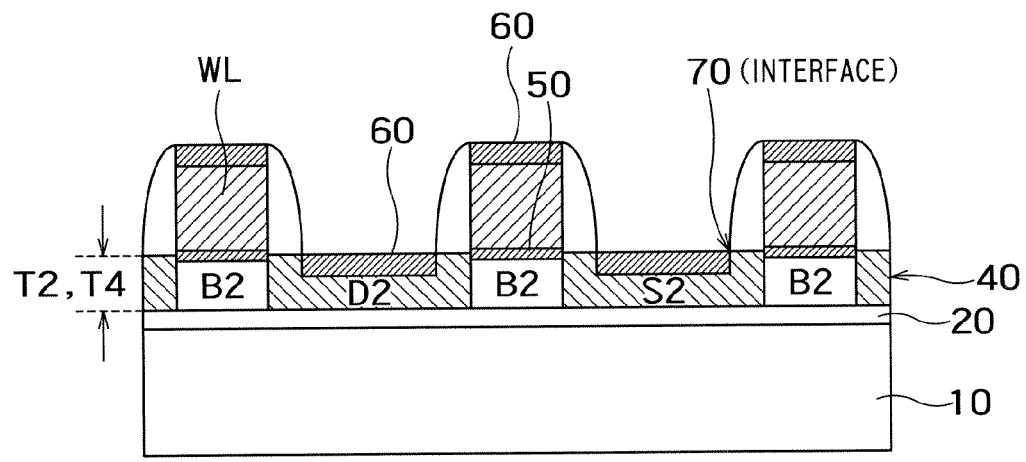
FIG. 4 is a cross-sectional view of the FBC memory device taken along a line 4-4 of FIG. 1.

FIG. 4 is a cross-sectional view of the FBC memory device taken along a line 4-4 of FIG. 1. FIG. 4 shows cross sections of the second body part B2, the second source part S2, and the second drain part D2 in an extension direction of the STI region and the SOI layer 40. Therefore, the cross sections of B2, D2, B2, S2, B2, D2, and so on appear in FIG. 4 in that order.

Figure 5:
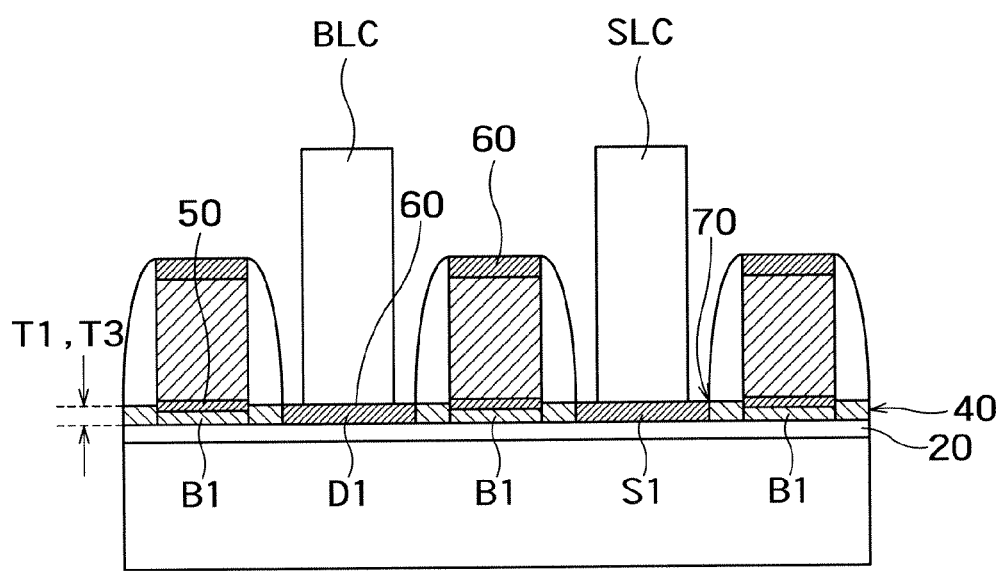
FIG. 5 is a cross-sectional view of the FBC memory device taken along a line 5-5 of FIG. 1.

FIG. 5 is a cross-sectional view of the FBC memory device taken along a line 5-5 of FIG. 1. FIG. 5 shows cross sections of the first body part B1, the first source part S1, and the first drain part D1 in the extension direction of the STI region 30 and the SOI layer 40. Therefore, the cross sections of B1, D1, B1, S1, B1, D1, and so on appear in FIG. 5 in that order.

What is to be noted is the difference between thicknesses T2 and T4 shown in FIG. 4 and thicknesses T1 and T3 shown in FIG. 5. The thicknesses T1 and T3 are smaller than the thicknesses T2 and T4. The thicknesses T1 and T3 may be either equal or different, further the thicknesses T2 and T4 may be either equal or different.

In the present embodiment, as shown in FIGS. 2, 4, and 5, the thickness T1 of the first body part B1 is set smaller than the thickness T2 of the second body part B2. Preferably, the thickness T1 of the first body part B1 is smaller than the maximum depletion layer width formed in the body region. Namely, the first body part B1 is preferably in a fully-depleted state. If an acceptor concentration of the body region is set to $1 \times 10^{18}$ cm$^{-3}$, then the maximum depletion layer width is about 35 nm. The fully-depleted state of the first body part B1 can be realized by setting the thickness T to be equal to or smaller than 35 nm. Furthermore, by applying a negative potential to the support substrate 10, a surface accumulation layer is formed on a bottom of the body region.

If the body region is fully depleted and the surface accumulation layer is formed on the bottom of the body region, a threshold voltage difference ΔVth between data "1" and "0" is represented by the following Equation 1.

$$\Delta Vth = Csi/Cox \times \Delta VB \quad \text{(Equation 1)}$$

In the Equation 1, Csi indicates a capacitance of the depletion layer formed in the SOI layer 40, and Cox indicates a capacitance of the gate insulating film 50. In addition, ΔVB indicates a difference between a body potential of the memory cell that stores therein data "0" and that of the memory cell that stores therein data "1".

Furthermore, Csi/Cox indicates a coefficient that represents a strength of a body effect. The Csi is represented by ∈si/Tsi (Csi=∈si/Tsi). In the equation, ∈si indicates a dielectric constant and Tsi indicates a thickness of the SOI layer 40. According to the Equation 1, if the SOI layer 40 is thinner, the Csi becomes larger. In addition, if the Csi is larger, then the body effect becomes greater and the threshold voltage difference ΔVth can be increased. Namely, the amount of signal of the FBC can be increased by setting the thickness T1 of the first body part B1 smaller than the thickness T2 of the second body part B2.

In the present embodiment, the thickness T3 of the first drain part D1 is smaller than the thickness T4 of the second drain part D2 as shown in FIGS. 3 to 5. Due to this, a boundary or an interface 70 between the silicide layer 60 and the SOI layer 40 is formed on a side surface of the SOI layer 40 located between the first and second drain parts D1 and D2 and on an upper surface of the SOI layer 40 within the second drain part D2.

Generally, a contact resistance between silicide and silicon is higher than an internal resistance of the silicide. The contact resistance between the silicide and the silicon and a resistance of a silicon layer greatly influence a parasitic resistance. It is, therefore, preferable that a contact area between the silicide and the silicon is larger. However, according to a conventional technique, if the SOI layer is made thinner, the contact area between the silicide and the silicon becomes smaller. With reference to, for example, FIG. 5, if the SOI layer is thinner, an area of the interface 70, i.e., the contact area between the silicide 60 and the SOI 40 becomes smaller. According to the conventional technique, because of lack of a stepped portion in each of the drain layer and the source layer as shown in FIG. 3, the thinner SOI layer causes an increase in parasitic resistance.

In the present embodiment, by contrast, by setting the thickness T3 of the first drain part D1 different from the thickness T4 of the second drain part D2, the stepped portion is formed in the boundary 70. By providing the stepped portion, the area of the interface 70, i.e., the contact area between the silicide layer 60 and the SOI layer 40 can be made larger than that according to the conventional technique. As a result, even if the SOI layer is thinner, the parasitic resistance can be suppressed to be low.

In this manner, according to the present embodiment, it is possible to avoid the increase in parasitic resistance while increasing the threshold voltage difference $\Delta Vth$ by making the SOI layer in a central portion of the body region thinner in the cross section along the word line WL.

Moreover, because the second body part B2 thicker than the first body part B2 is adjacent to the STI region 30, a fringing capacitance is higher. The fringing capacitance means a capacitance generated between the support substrate 10 under the STI region 30 and a side surface of the body region. The increased fringing capacity contributes to an increase in a capacitance Csub between the support substrate 10 and the body region. As will be explained later in a third embodiment of the present invention, if the capacitance Csub is increased, the threshold voltage difference $\Delta Vth$ is increased.

FIGS. 6A to 10B are cross-sectional views of the FBC memory device, showing a method of manufacturing the FBC memory device according to the first embodiment. FIGS. 6A, 7A, 8A, 9A, and 10A show a cross section of the memory region, and FIGS. 6B, 7B, 8B, 9B, and 10B show a cross section of the logic circuit region.

First of all, the SOI substrate is prepared. The SOI substrate is a substrate configured so that the BOX layer 20 serving as the insulating film and the SOI layer 40 serving as the semiconductor layer are provided on the support substrate 10. The support substrate 10 is, for example, a silicon substrate. The BOX layer 20 is, for example, a silicon oxide film having a thickness of 10 nm. The SOI layer 40 is, for example, a single-crystal silicon having a thickness of 50 nm. A silicon oxide film 42 and a silicon nitride film 44 as a mask material are sequentially deposited on the SOI substrate.

Figure 6A:
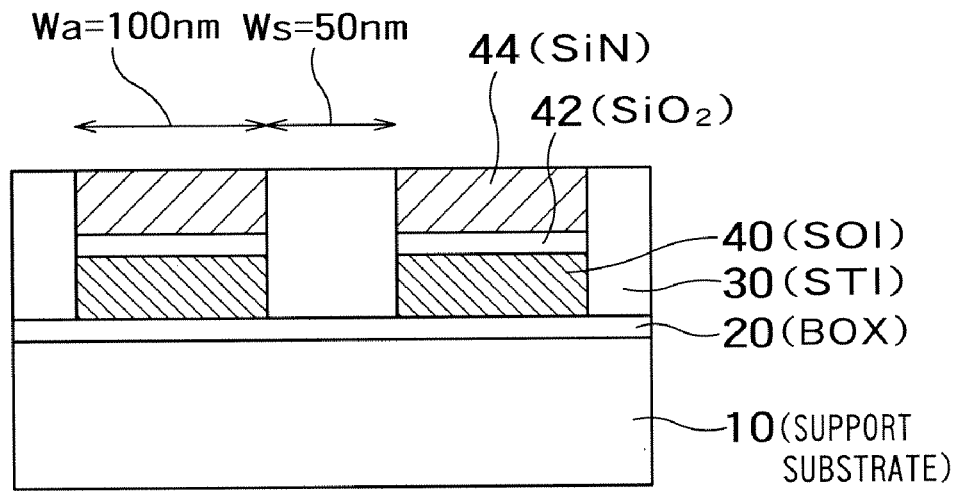
FIGS. 6A, 6B, 7A, 7B, 8A, 8B, 9A, 9B, 10A, and 10B are cross-sectional views of the FBC memory device, showing a method of manufacturing the FBC memory device according to the first embodiment.
Figure 6B:
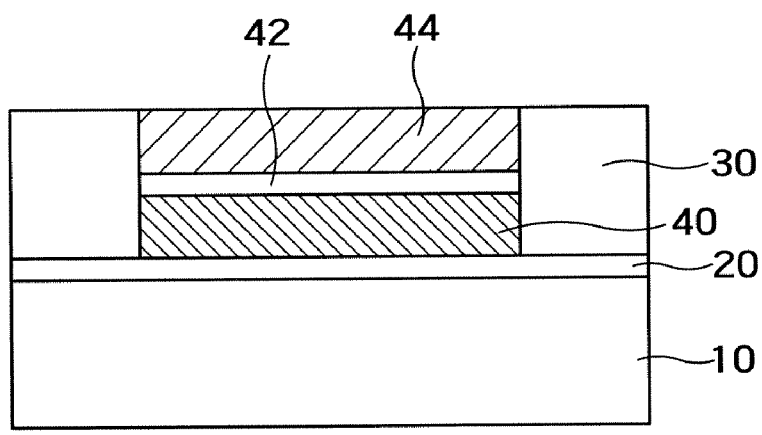

To form the STI region 30 in the element isolation region, the silicon oxide film 42, the silicon nitride film 44, and the SOI layer 40 present in the element isolation region are removed using photolithography and reactive ion etching (RIE). As a result, a trench that penetrates the silicon oxide film 42, the silicon nitride film 44, and the SOI layer 40 is formed. The trench is then filled with an insulating film such as a silicon oxide film, thereby forming the STI region 30 as shown in FIGS. 6A and 6B. In the present embodiment, a width Wa of an active region is about 100 nm and that of the STI region 30 is about 50 nm in the memory region.

After removing the silicon nitride film 44 and the silicon oxide film 42, a silicon oxide film 43 is formed. The silicon oxide film 43 has a thickness of, for example, 8 nm. Thereafter, boron ions at a concentration of about $1 \times 10^{18}$ cm$^{-3}$ are implanted, as P-type impurities, into the SOI layer 40. To adjust threshold voltages of an N-type field-effect transistor (N-FET) and a P-type field-effect transistor (P-FET), some impurities are also implanted into the logic circuit region.

A silicon nitride film serving as a sidewall material is deposited on the STI region 30 and the silicon oxide film 43. A thickness of the silicon nitride film is, for example, 30 nm.

Figure 7A:
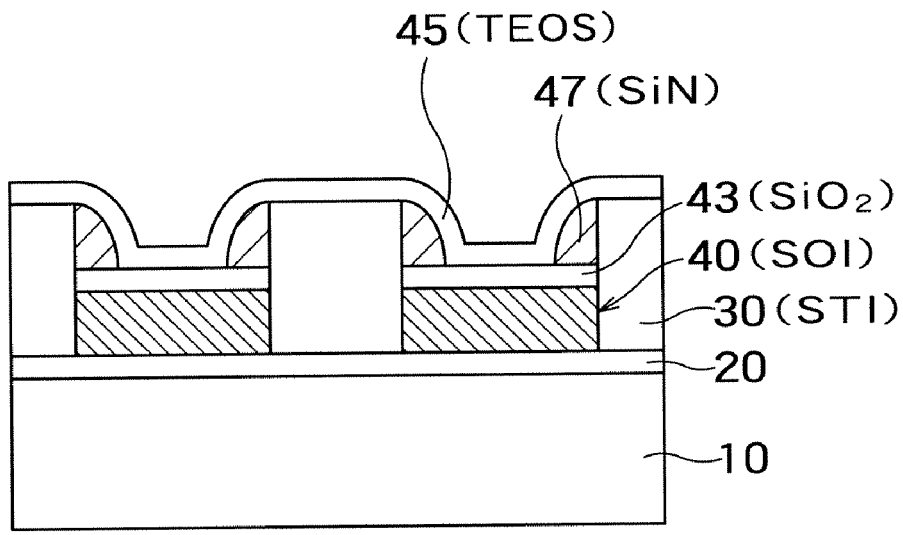
Figure 7B:
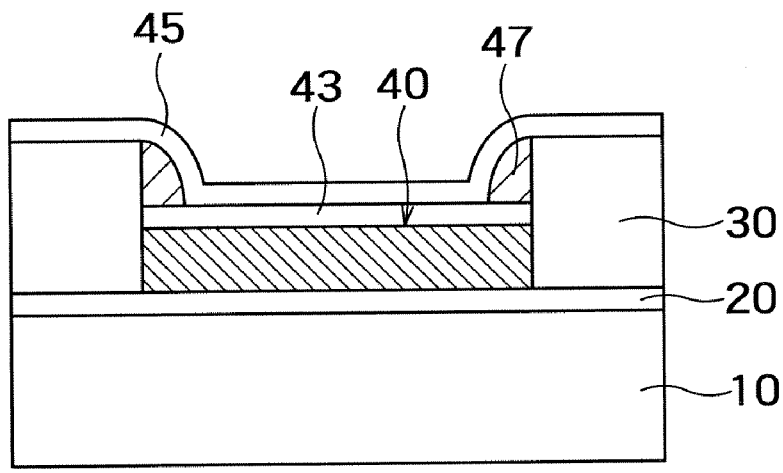

Further, the silicon nitride film is anisotropically etched by the RIE. As a result, a sidewall film 47 is left on a side surface of the STI region 30 as shown in FIGS. 7A and 7B. At this moment, the sidewall film 47 covers up the second body part B2, the second source part S2, and the second drain part D2 but does not cover up the first body part B1, the first source part S1, and the first drain part D1. Because a width of the second body part B2 is determined according to a width of the sidewall film 47, a pair of second body parts B2 are equal in width. Accordingly, the present embodiment is suitable for manufacturing of a memory device smaller in characteristic fluctuations.

Figure 8A:
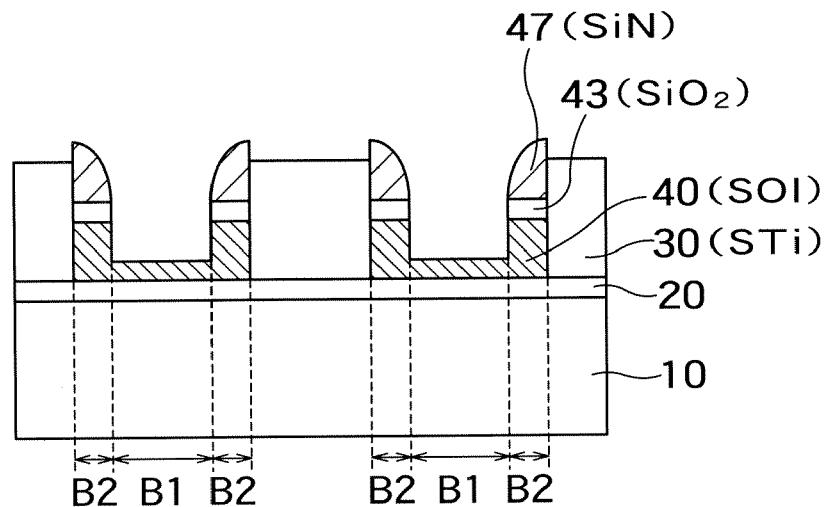
Figure 8B:
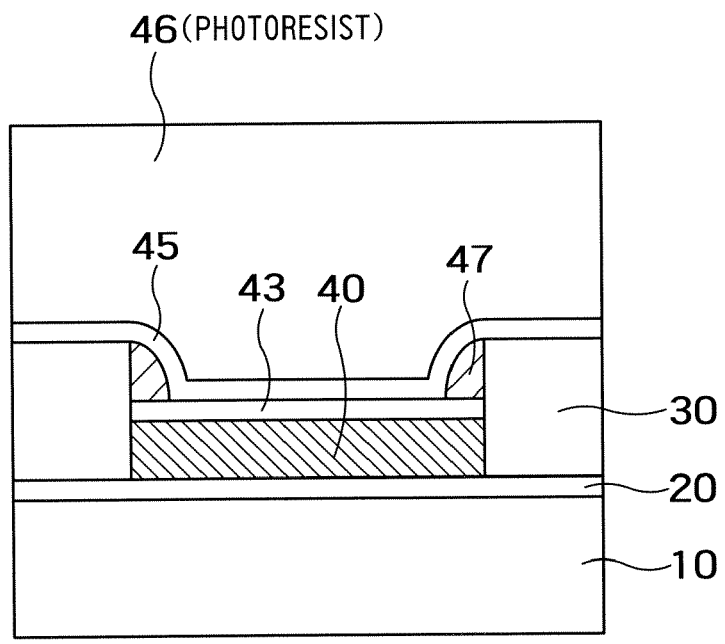

A TEOS film 45 is then deposited on the STI region 30, the sidewall film 47, and the silicon oxide film 43. A thickness of the TEOS film 45 is, for example, 8 nm. As shown in FIG. 8B, the logic circuit region is covered with a resist 46 by using the photolithography. Wet etching is then performed to remove the TEOS film 45 in the memory region. Using the sidewall film 47 as a mask, an upper portion of the SOI layer 40 is anisotropically etched. As a result, as shown in FIG. 8A, the first body part B1 that is not covered with the sidewall 47 in the body region of the FBC is made thinner. The first source part S1 that is not covered with the sidewall 47 in the source region of the FBC is made thinner. In addition, the first drain part D1 that is not covered with the sidewall 47 in the drain region of the FBC is made thinner. A thickness of each of the first body part B1, the first source part S1, and the first drain part D1 is, for example, 20 nm. At this moment, the second body part B2, the second source part S2, and the second drain part D2 are covered with the sidewall 47 and are not, therefore, etched. Furthermore, the SOI layer 40 in the logic circuit region is covered with the resist 46 and is not etched accordingly.

Although FIG. 8A does not show thicknesses of the source region and the drain region, respectively, the thicknesses can be understood from FIGS. 3 to 5.

Figure 9A:
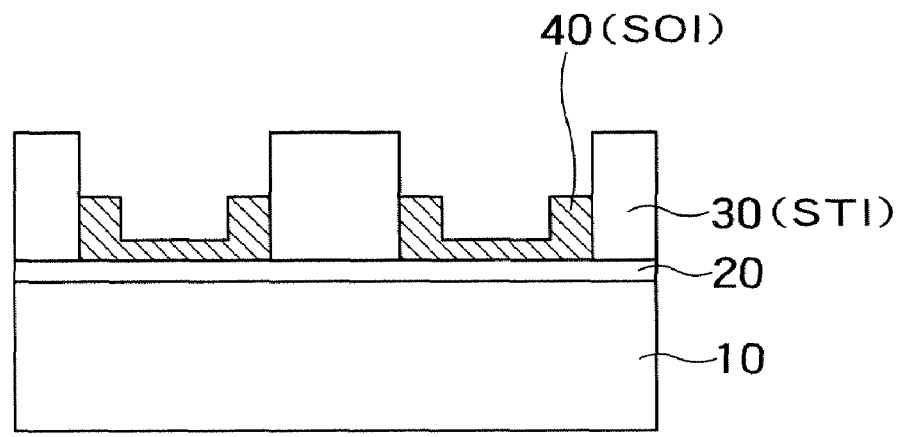
Figure 9B:
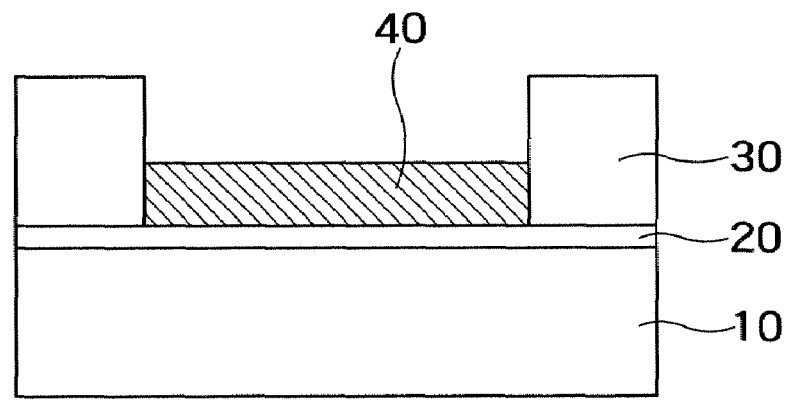

As shown in FIGS. 9A and 9B, after removing the resist 46 and the TEOS film 45, a silicon oxide film having a thickness of 6 nm is formed at a thermal oxidation step. At the thermal oxidation step, the SOI layer 40 is further thinned in the first body part B1, the first source part S1, and the first drain part D1. Therewith, damages generated on the SOI layer 40 by the RIE are removed by the thermal oxidation step. Subsequently, the sidewall film 47 is removed by a hot phosphoric acid solution. The silicon oxide film having the thickness of 6 nm in the memory region and the silicon oxide film 43 in the logic circuit region are then removed.

Figure 10A:
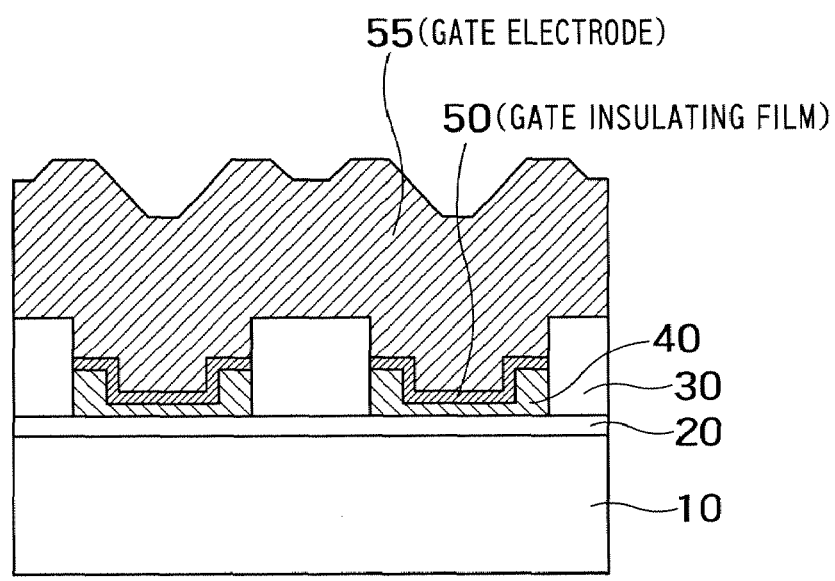
Figure 10B:
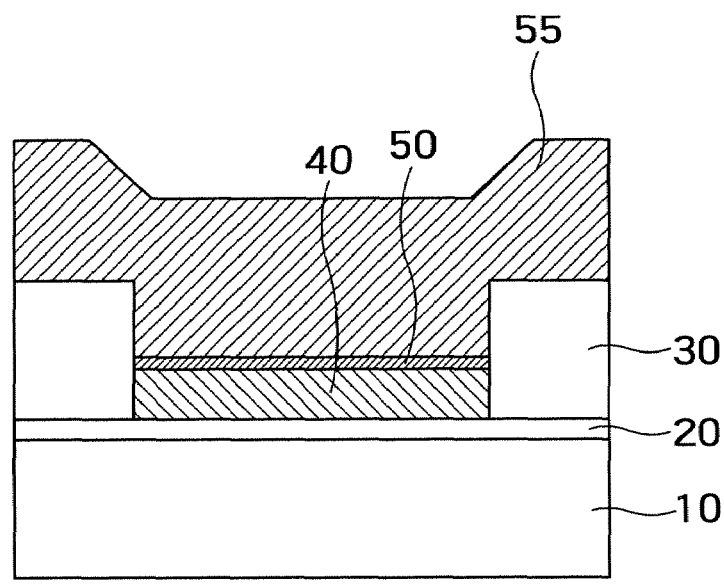

As shown in FIGS. 10A and 10B, a gate insulating film 50 is formed on the first body part B1 and the second body part B2. A thickness of the gate insulating film 50 is, for example, 5 nm. A gate electrode 55 is formed on the gate insulating film 50. A gate length of the gate electrode 55 is, for example, 50 nm. The gate insulating film 50 and the gate electrode 55 may be formed on the logic circuit region simultaneously with formation thereof on the memory region. Alternatively, the gate insulating film 50 and the gate electrode 55 may be formed on the logic circuit region at a different step.

Using the gate electrode 55 as a mask, arsenic or phosphorus ions are implanted, as N-type impurities, into the source and drain regions. For instance, the phosphorus ions at a dosage of $1 \times 10^{13}$ cm$^{-2}$ are implanted at an acceleration energy of 2 keV.

Thereafter, a silicide layer 60 is formed on the gate electrode 55 (as shown in FIG. 2) and on the source and drain regions (as shown in FIG. 3). An interlayer insulating film, a bit-line contact BLC, a source-line contact SLC and the like are formed by a conventional process. The FBC memory device according to the first embodiment is thus completed.

Second Embodiment

FIG. 11 is a cross-sectional view of an FBC memory device according to a second embodiment of the present invention. In the second embodiment, the thickness of the SOI layer 40 is gradually and smoothly changed in a boundary between the first body part B1 and the second body part B2. The second embodiment can exhibit the same advantages as those of the first embodiment.

FIGS. 12A to 13B are cross-sectional views showing a method of manufacturing the FBC memory device according to the second embodiment.

After the step explained with reference to FIGS. 6A and 6B, the silicon nitride film 44 and the silicon oxide film 42 are removed, and the silicon oxide film 43 is then formed. The thickness of the silicon oxide film 43 is, for example, 8 nm. Boron ions at a concentration of about $1 \times 10^{18}$ cm$^{-3}$ are implanted, as P-type impurities, into the SOI layer 40.

Figure 12A:
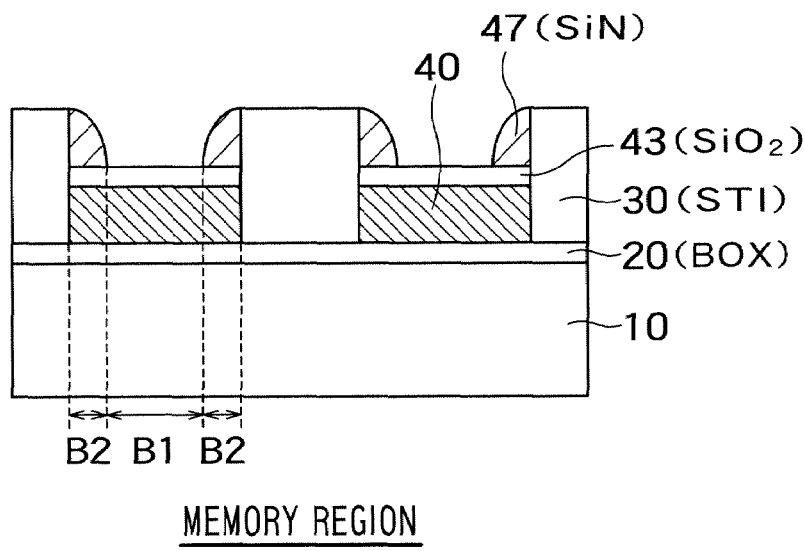
FIGS. 12A, 12B, 13A, and 13B are cross-sectional views showing a method of manufacturing the FBC memory device according to the second embodiment.
Figure 12B:
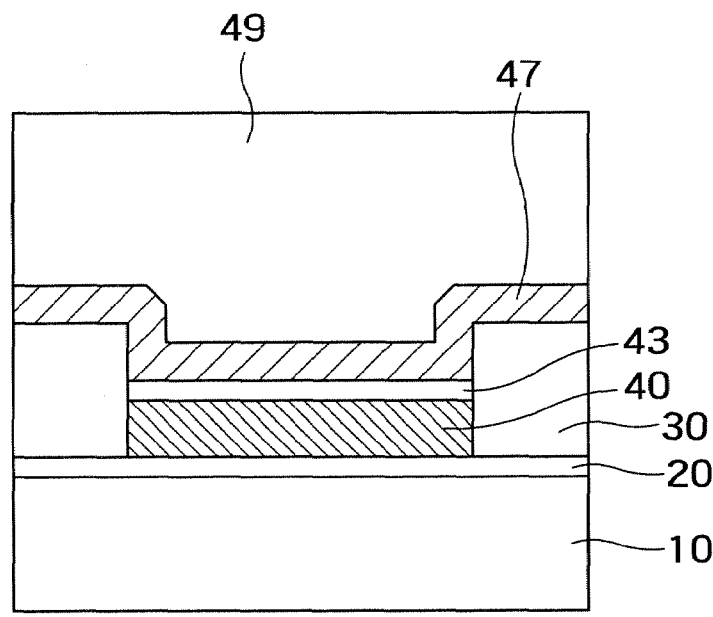

A silicon nitride film serving as a sidewall material is deposited on the STI region 30 and the silicon oxide film 43. A thickness of the silicon nitride film is, for example, 30 nm. Further, the silicon nitride film is anisotropically etched by an RIE and a photolithography. As a result, the sidewall film 47 is left on the side surface of the STI region 30 as shown in FIG. 12A. At this moment, the sidewall film 47 covers up the second body part B2, the second source part S2, and the second drain part D2 but does not cover up the first body part B1, the first source part S1, and the first drain part D1. In the logic circuit region, the silicon nitride film 47 covers up an active region as shown in FIG. 12B.

Figure 13A:
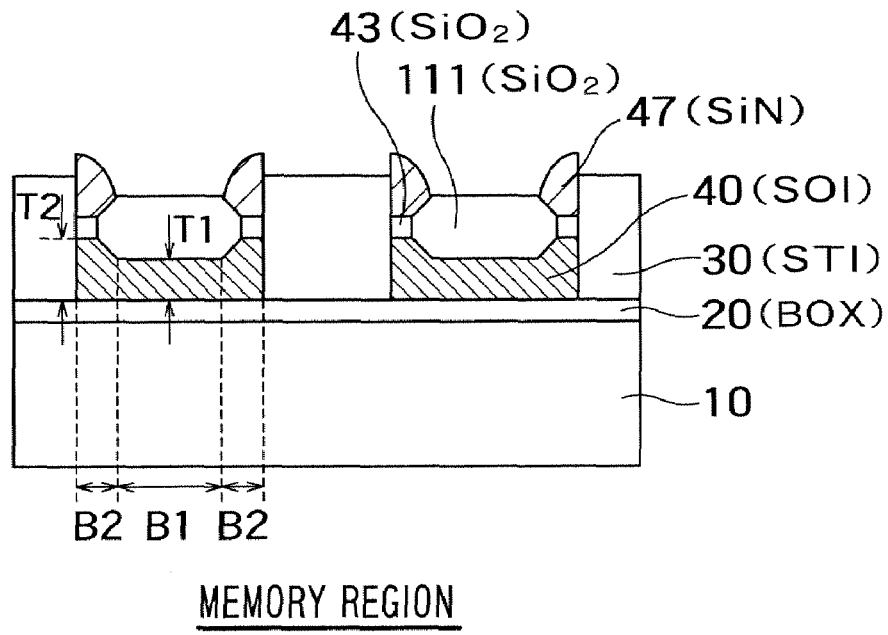
Figure 13B:
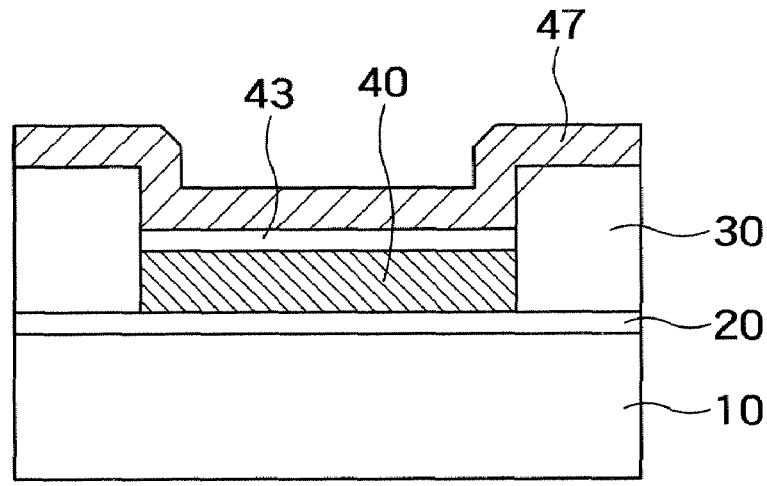

After removing the resist 49, the SOI layer 40 is oxidized by thermal oxidation. At this moment, as shown in FIG. 13A, an upper portion of the first body part B1 is oxidized but the second body part B2 is not as oxidized as the first body part B1. Due to this, the thickness T1 of the first body part B1 is smaller than the thickness T2 of the second body part B2.

A silicon oxide film 111 is removed by wet etching. After removing the silicon nitride film 47 in the memory region and the logic circuit region, impurities are implanted into the logic circuit region to adjust threshold voltages of an N-FET and a P-FET.

With the manufacturing method according to the second embodiment, the body region is less damaged than the body region manufactured with the manufacturing method including making the first body part B1 thinner by the anisotropic etching. It is, therefore, possible to keep a quality of the silicon crystal of the SOI layer 40 high. The second embodiment is, therefore, suitable for manufacturing of an FBC memory device having a long data retention time.

Third Embodiment

Figure 14:
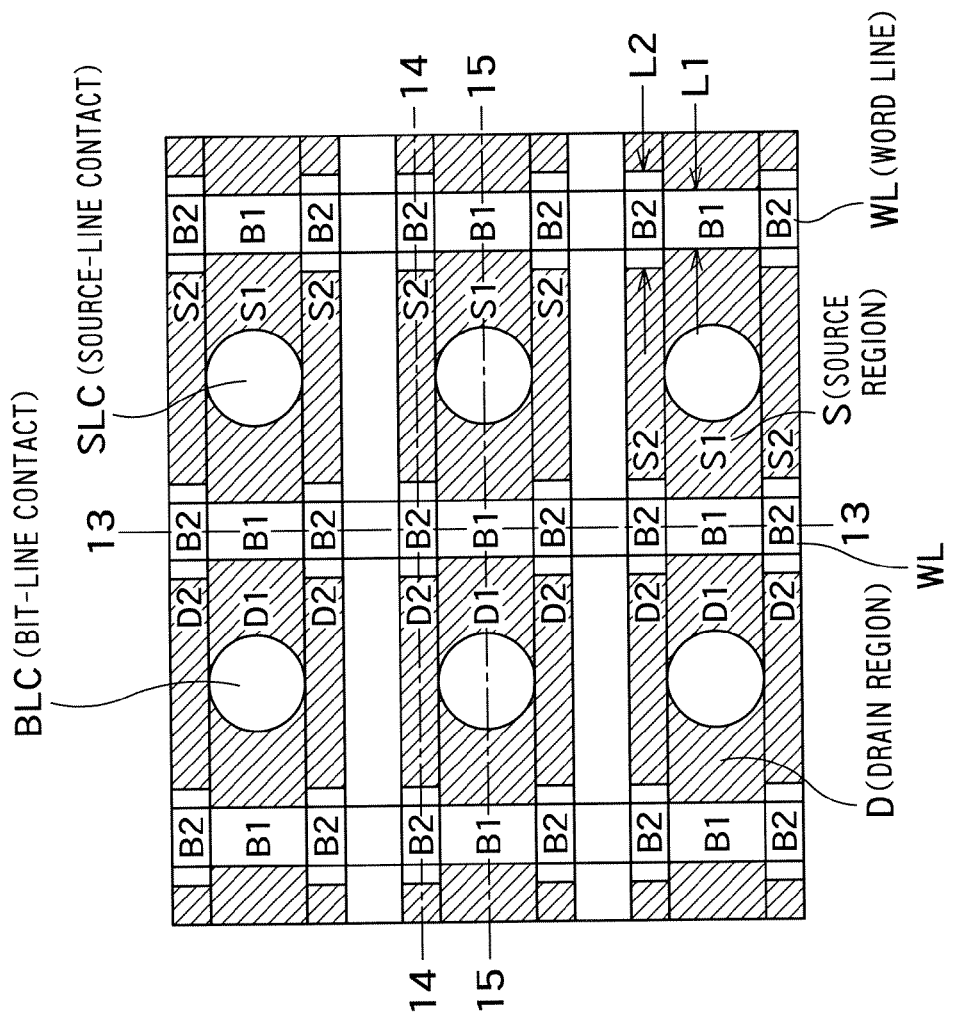
FIG. 14 is a plan view of an FBC memory device according to a third embodiment.

FIG. 14 is a plan view of an FBC memory device according to a third embodiment of the present invention. In the third embodiment, a width L1 of the first body part B1 located between the first source part S1 and the first drain part D1 differs from a width L2 of the second body part B2 located between the second source part S2 and the second drain part D2. The width L1 is substantially equal to the gate length.

Figure 15:
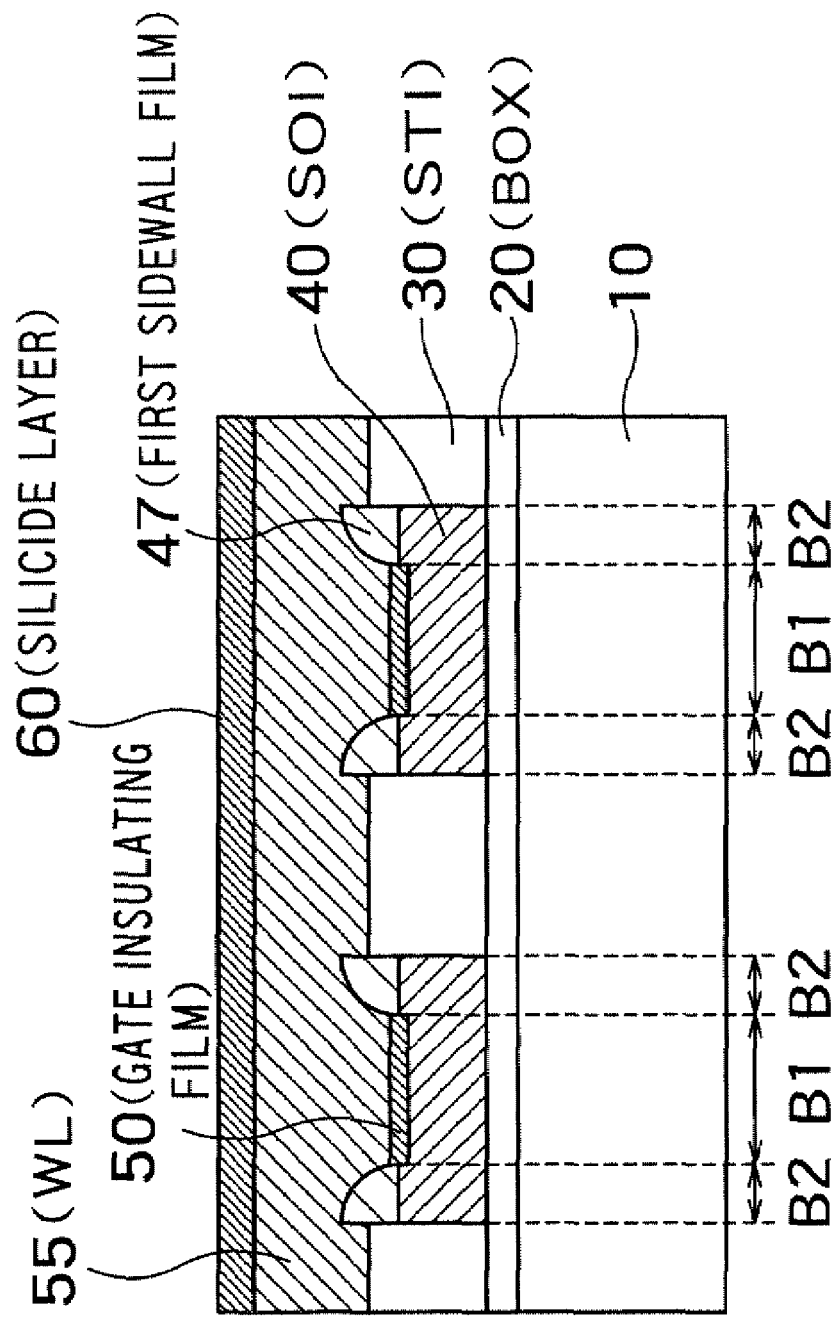
FIG. 15 is a cross-sectional view of the FBC memory device taken along a line 13-13 of FIG. 14.

FIG. 15 is a cross-sectional view of the FBC memory device taken along a line 13-13 of FIG. 14. FIG. 15 shows a cross section of the FBC memory device cut in the extension direction of the word line WL. Accordingly, cross sections of the first body part B1 and the second body part B2 appear in FIG. 15. In the present embodiment, the first body part B1 is substantially equal in thickness to the second body part B2. However, a first sidewall film 47 thicker than the gate insulating film 50 is provided on the second body part B2. The first sidewall film 47 is, for example, a silicon oxide film or a silicon nitride film.

The word line (gate electrode) WL is provided on the gate insulating film 50 and on the first sidewall film 47. By applying a voltage to the word line WL, a channel is formed in the first body part B1.

By providing the first sidewall film 47, a capacitance Cg between the gate electrode (word line) WL and the body region becomes smaller. Generally, a total capacitance of the body region is represented by Cg+Csub+Cd+Cs. The Csub indicates the capacitance between the support substrate 10 and the body region, the Cd indicates the capacitance between the drain region and the body region, and the Cs indicates the capacitance between the source region and the body region. The body potential difference ΔVB between the body region of the memory cell that stores therein data "0" and that of the memory cell that stores therein data "1" is represented by (Csub/(Cg+Csub+Cd+Cs))×VBLL. The VBLL indicates an amplitude of a bit line potential when the data "0" is written to the memory cell. As shown in the Equation 1, the threshold potential difference ΔVth is proportional to the body potential difference ΔVB. Accordingly, if a ratio of the Csub to the total capacitance of the body region (R=Csub/(Cg+Csub+Cd+Cs)) is higher, the threshold voltage difference ΔVth between the FBC that stores therein data "0" and the FBC that stores therein data "1" becomes greater.

In the third embodiment, if the capacitance Cg between the gate electrode and the body region is smaller, the capacitance ratio R becomes higher. The threshold voltage difference ΔVth is, therefore, greater.

Figure 16:
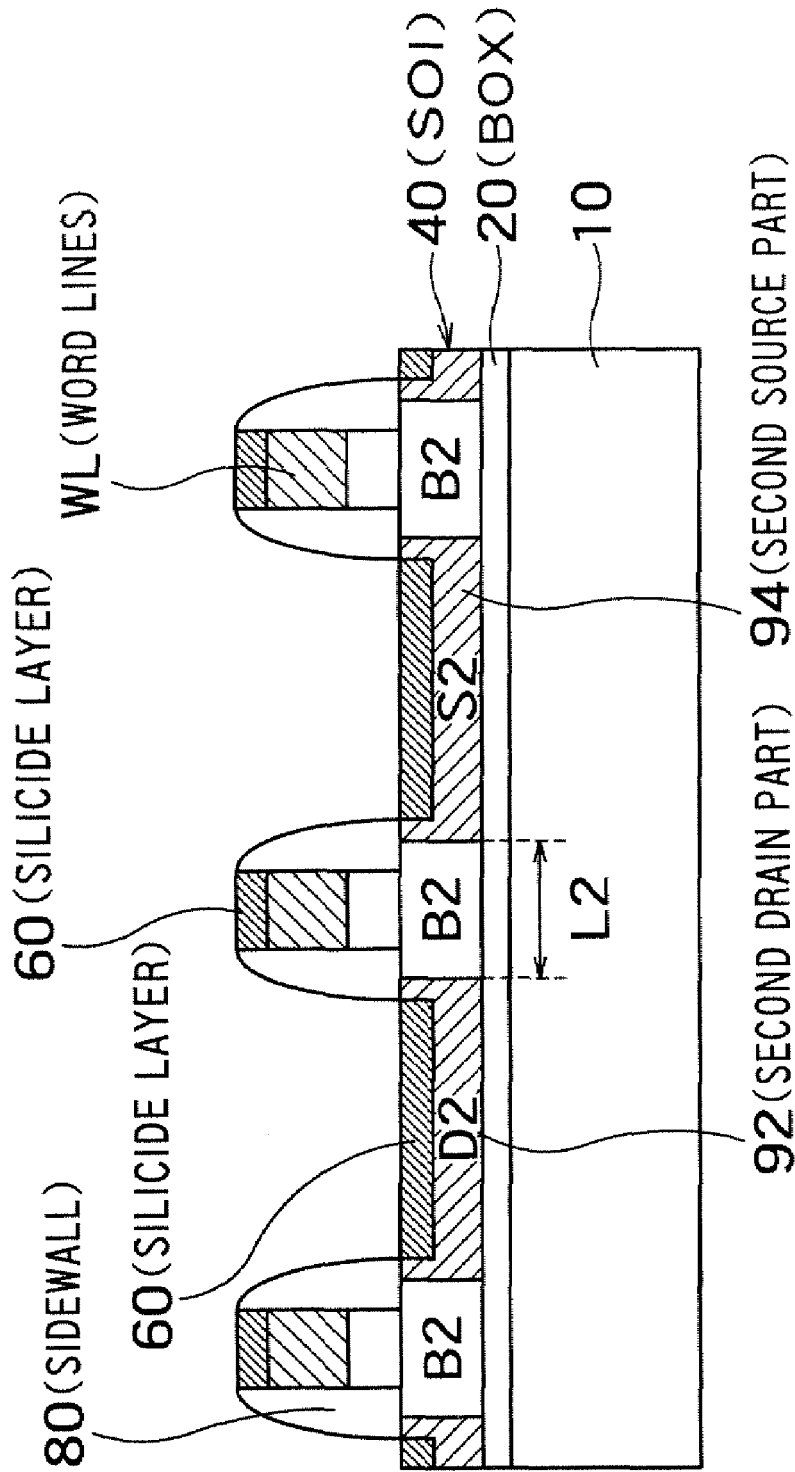
FIG. 16 is a cross-sectional view of the FBC memory device taken along a line 14-14 of FIG. 14.

FIG. 16 is a cross-sectional view of the FBC memory device taken along a line 14-14 of FIG. 14. FIG. 16 shows cross sections of the second body part B2, the second source part S2, and the second drain part D2 in the extension direction of the STI region 30 and the SOI layer 40. Therefore, the cross sections of B2, D2, B2, S2, B2, D2, and so on appear in FIG. 16 in that order.

Figure 17:
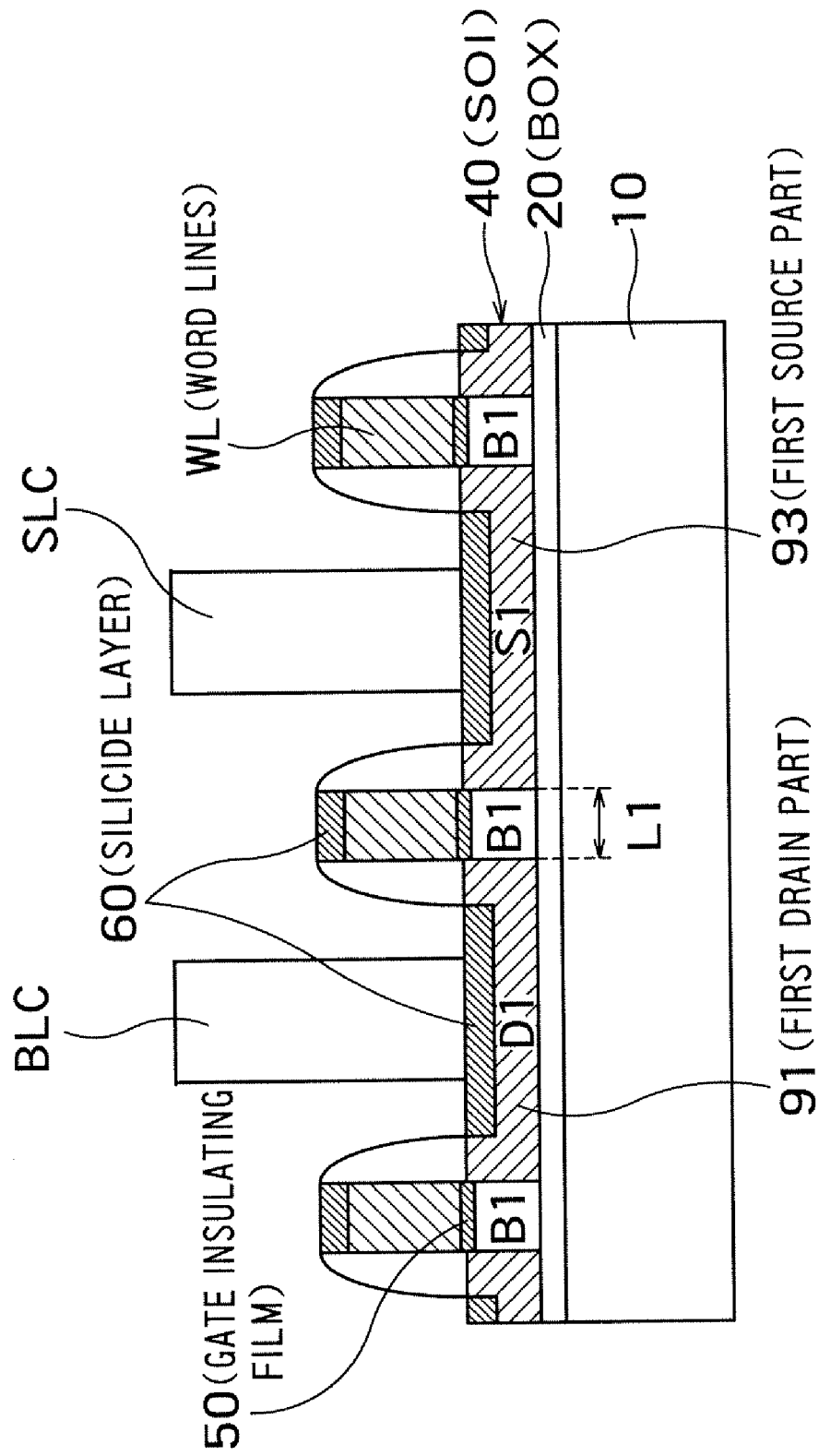
FIG. 17 is a cross-sectional view of the FBC memory device taken along a line 15-15 of FIG. 14.

FIG. 17 is a cross-sectional view of the FBC memory device taken along a line 15-15 of FIG. 14. FIG. 17 shows cross sections of the first body part B1, the first source part S1, and the first drain part D1 in the extension direction of the STI region 30 and the SOI layer 40. Therefore, the cross sections of B1, D1, B1, S1, B1, D1, and so on appear in FIG. 17 in that order.

In the third embodiment, as shown in FIGS. 16 and 17, the width (gate length) L1 of the first body part B1 is smaller than the width L2 of the second body part B2. By applying a predetermined voltage to the gate electrode, a channel is formed on a surface of the first body part B1. Because the width L1 of the first body part B1 is relatively small, a high drain current is applied. This can increase an impact ionization current in a central portion of the body region. As a result, a write speed of writing the data "1" can be accelerated. The increase in the impact ionization current is represented by the following equation. A substrate current Isub is represented by Isub=(M−1)×Id. In the equation, M indicates an avalanche multiplication coefficient and Id indicates a drain current. The avalanche multiplication coefficient M exponentially depends on an electric field in a channel direction. Accordingly, if the gate length is made smaller, the avalanche multiplication coefficient is greatly increased. The drain current Id is increased proportionally with the gate length. By making the gate length smaller, the substrate current Isub is rapidly increased by a synergic effect between the rapid increase of the avalanche multiplication coefficient M and the increase of the drain current Id. The high Isub means a high impact ionization current. Therefore, if the gate length is made smaller, write time becomes greatly shorter.

Furthermore, if the width L1 of the first body part B1 is smaller, it is possible to narrow a distance between the bit-line contact BLC and the source-line contact SLC. This follows that a size of a memory cell can be reduced and, therefore, cost can be reduced.

If the width L1 of the first body part B1 is smaller, the capacitance Csub between the support substrate 10 and the body region is reduced. However, by setting the width L2 of the second body part B2 large, the capacitance Csub is increased. Namely, the reduction of the capacitance Csub due to the reduction of the width L1 is compensated for by the increase of the capacitance Csub due to the increase of the width L2. If the Csub is increased, then the capacitance ratio R is increased, and the difference in amount of signals between the memory cell storing data "1" and the memory cell storing data "0". Therefore, by setting the width L2 large, it is possible to suppress the reduction of the threshold voltage difference ΔVth or to increase the threshold voltage difference ΔVth.

In this manner, the third embodiment can overcome the tradeoff relationship between the threshold voltage difference ΔVth and the write speed.

With a view of increasing the fringing capacitance between the support substrate 10 and the body region, the second body part B2 having such a large width L2 is preferably arranged adjacent to the STI region 30.

In the third embodiment, the first sidewall film 47 is made of the insulating film such as the silicon oxide film or silicon nitride film. Alternatively, the first sidewall film 47 may be a hollow.

Figure 18A:
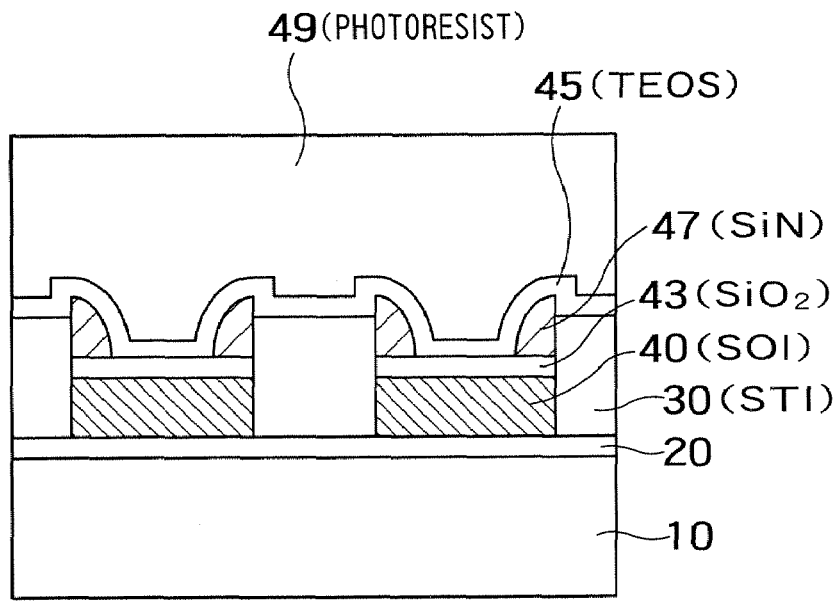
FIGS. 18A and 18B are cross-sectional views showing a method of manufacturing the FBC memory device according to the third embodiment.
Figure 18B:
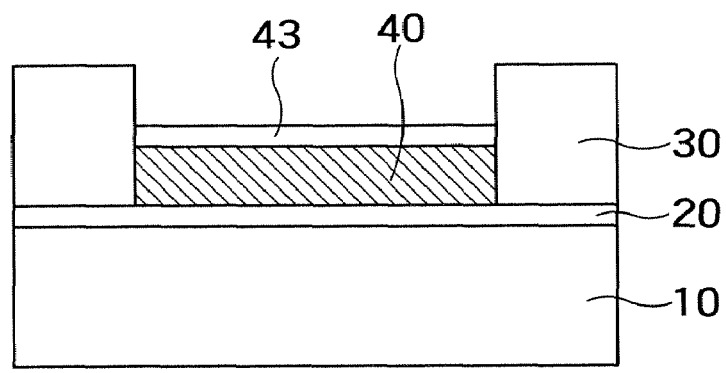

A method of manufacturing the FBC memory device according to the third embodiment will be explained. First of all, steps shown in FIGS. 6A to 7B are executed similarly to the first embodiment. Next, as shown in FIGS. 18A and 18B, the memory region is covered with the resist 49 by the photolithography. The sidewall film 47 serving as the first sidewall film is removed in the logic circuit region.

Figure 19A:
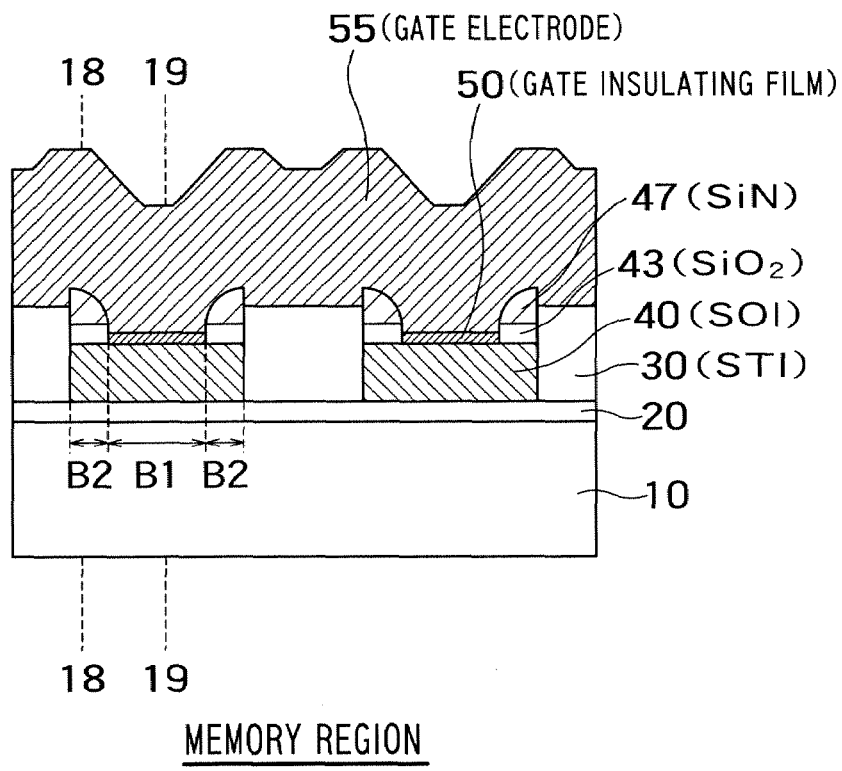
FIGS. 19A and 19B are cross-sectional views showing a method of manufacturing the FBC memory device subsequent to FIGS. 18A and 18B.
Figure 19B:
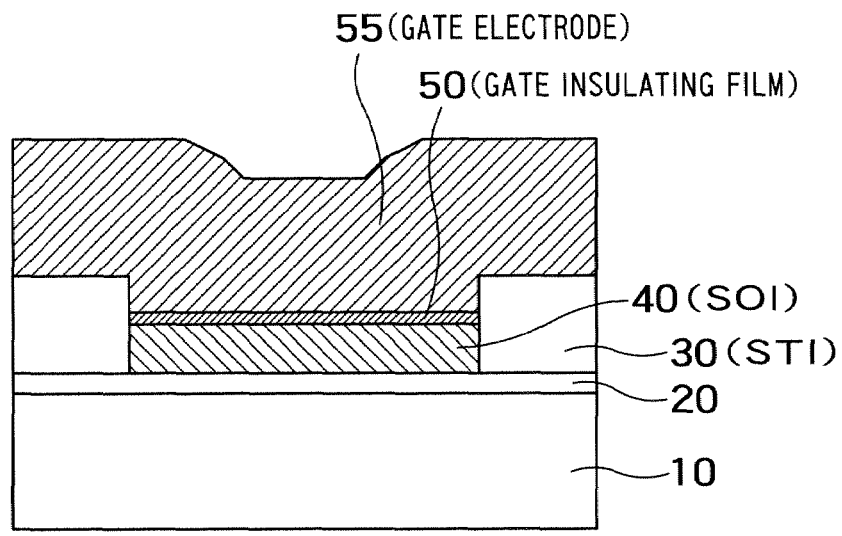

The resist 49, the TEOS film 45, and the silicon oxide film 43 are removed. Thereafter, as shown in FIGS. 19A and 19B, the gate insulating film 50 is formed on the SOI layer 40 in the first body part B1 that is not covered with the first sidewall film 47. The gate electrode 55 is then formed on the gate insulating film 50. The gate electrode 55 extends in a perpendicular direction to an extension direction of the first sidewall film 47. At the same time, the gate insulating film 50 and the gate electrode 55 may be formed in the logic circuit region. Alternatively, the gate insulating film 50 and the gate electrode 55 may be formed in the logic circuit region at a different step from that of forming the gate insulating film 50 and the gate electrode 55 in the memory region. The thickness of the gate insulating film 50 is, for example, 5 nm. The gate length of the gate electrode 55 is, for example, 50 nm.

Figure 20:
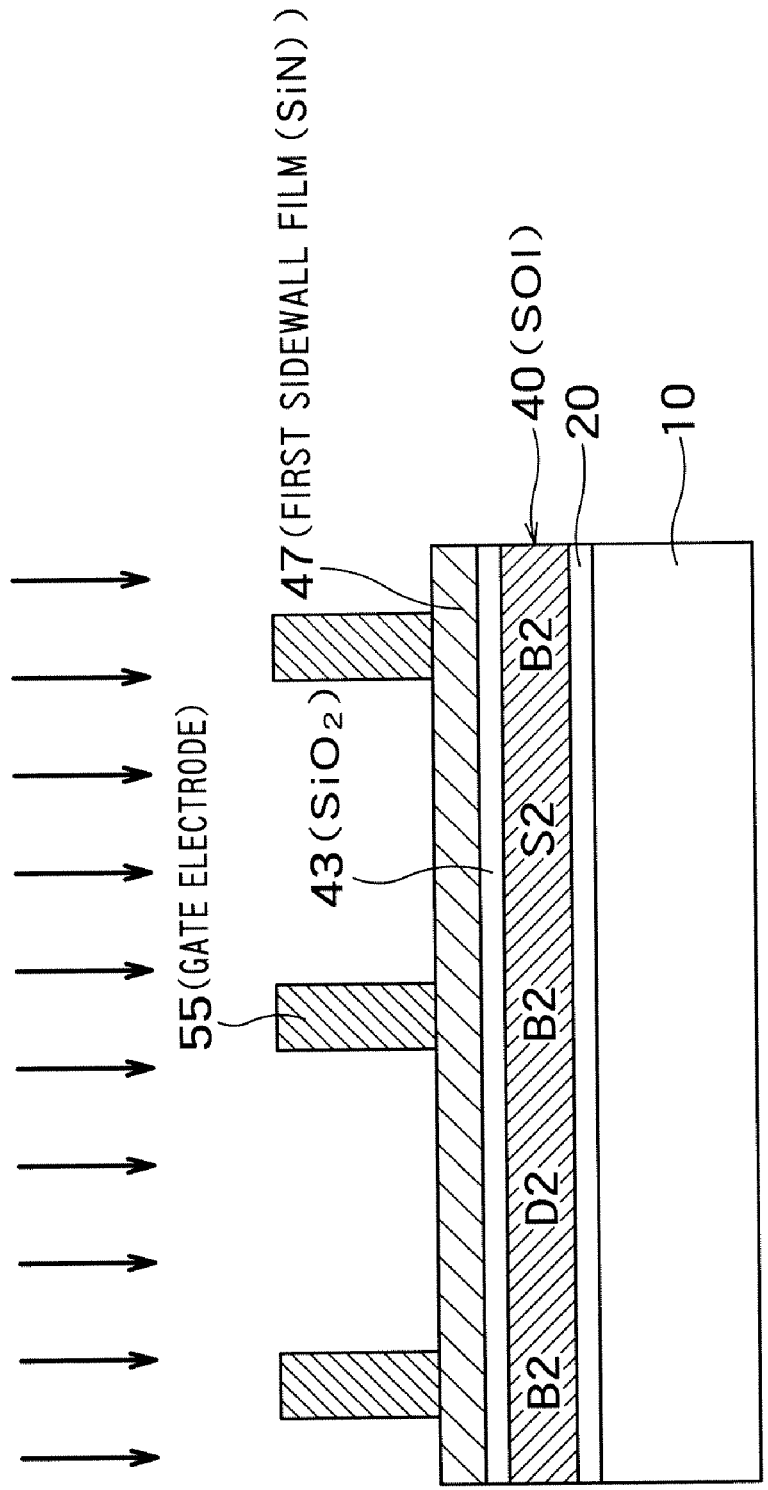
FIG. 20 is a cross-sectional view of the FBC memory device taken along a line 18-18 of FIG. 19.
Figure 21:
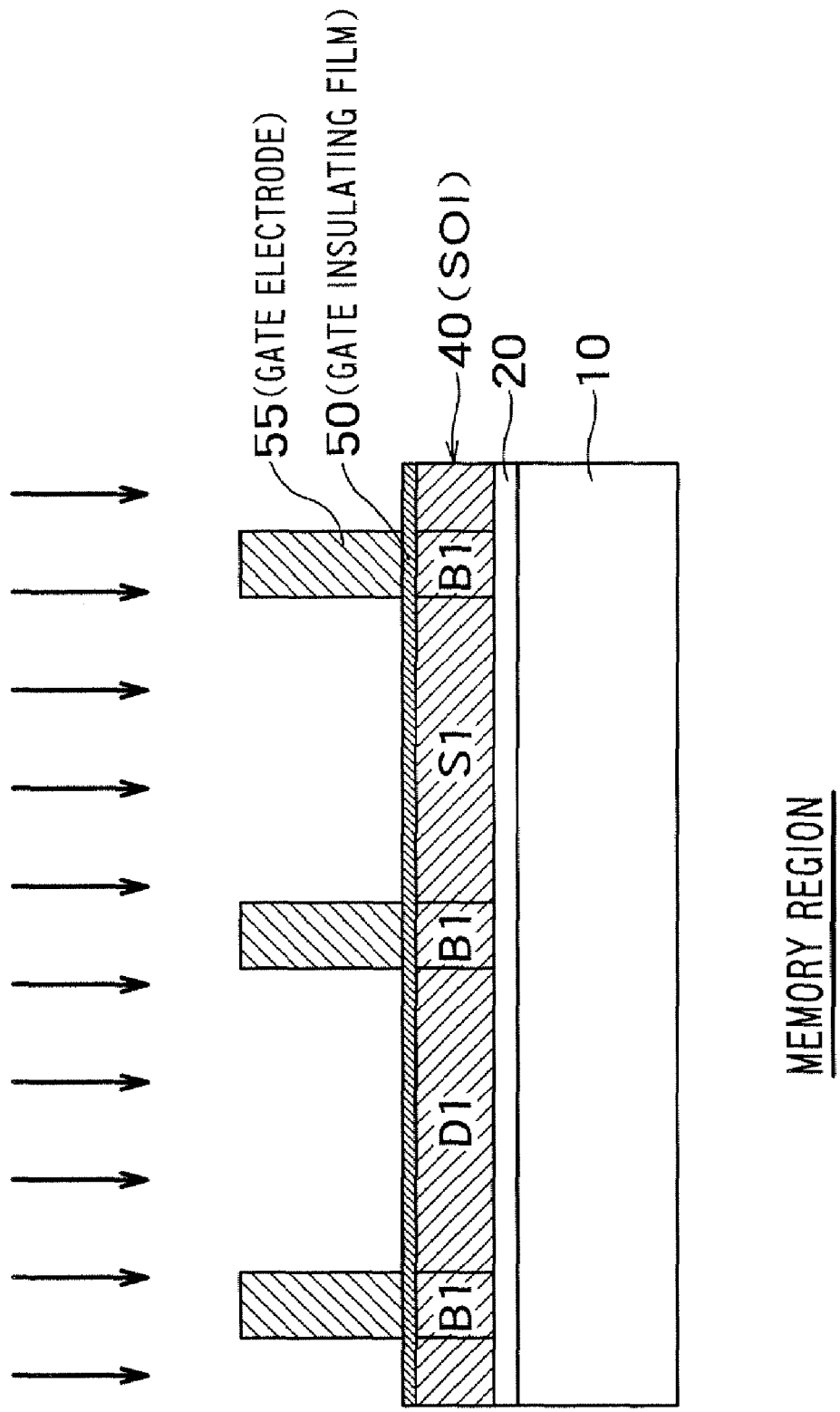
FIG. 21 is a cross-sectional view of the FBC memory device taken along a line 19-19 of FIG. 19.

FIG. 20 is a cross-sectional view of the FBC memory device taken along a line 18-18 of FIG. 19. FIG. 21 is a cross-sectional view of the FBC memory device taken along a line 19-19 of FIG. 19. After processing the gate electrode 55, arsenic or phosphorus ions are implanted, as N-type impurities for formation of a source and a drain, into the source region and the drain region with the gate electrode 55 used as a mask. The arsenic or phosphorus ions are implanted into the source region and the drain region at a dosage of, for example, $1 \times 10^{13}$ cm$^{-2}$ at an acceleration energy of, for example, 2 keV. The first source part S1 and the first drain part D1 are thereby formed.

At this moment, as shown in FIG. 20, the first sidewall film 47 covers up the second source part S2 and the second drain part D2. The thickness of the first sidewall film 47 is, for example, 50 nm. At the ion implantation step, therefore, no impurities are implanted into the second source part S2 and the second drain part D2. On the other hand, as shown in FIG. 21, the first sidewall film 47 does not cover up the first source part S1 and the first drain part D1. At the ion implantation step, therefore, the impurities are implanted into the first source part S1 and the first drain part D1. As a result of the ion implantation step, the width L1 of the first body part B1 between the first drain part D1 and the first source part S1 shown in FIG. 14 is determined.

Figure 22:
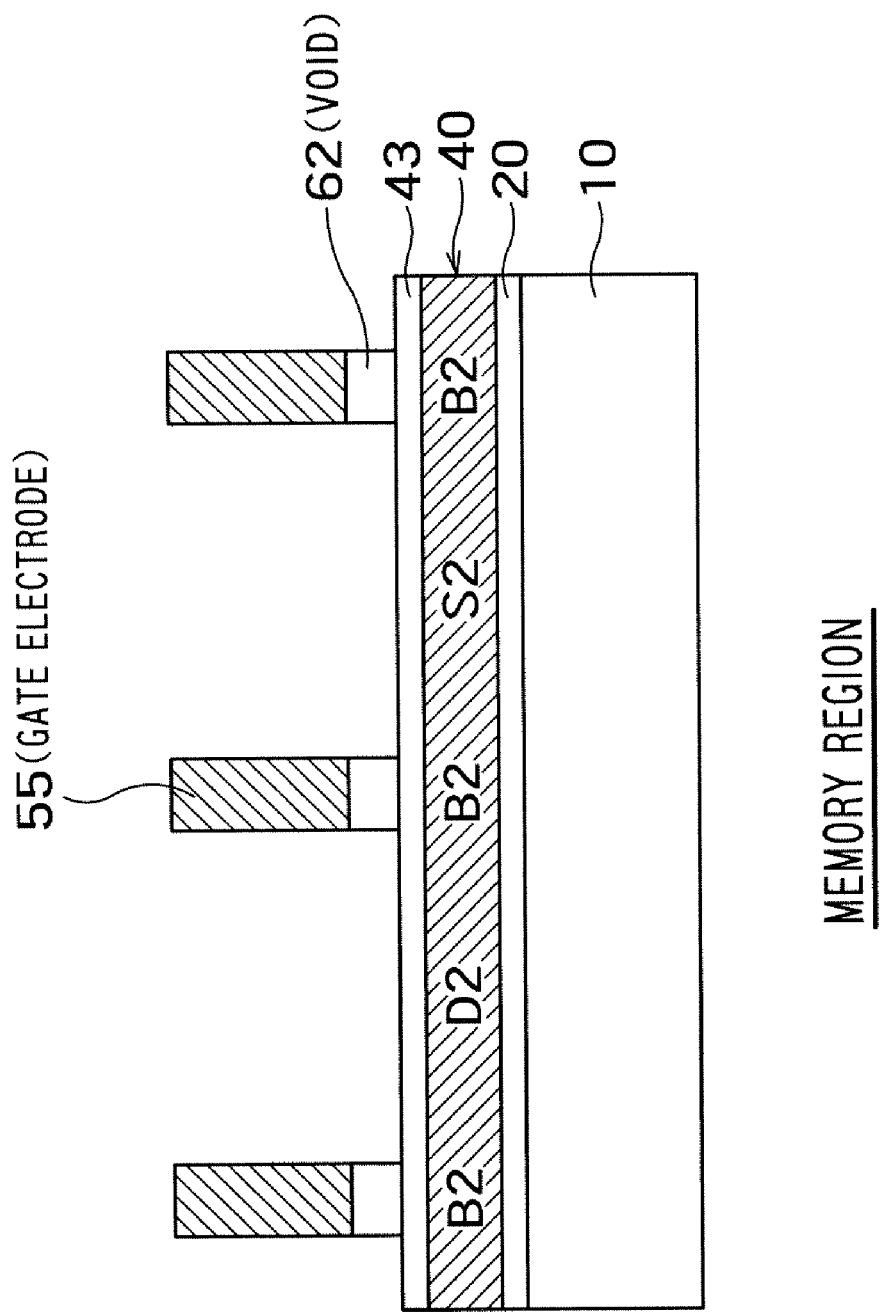
FIG. 22 is a cross-sectional view of the FBC memory device subsequent to FIG. 20.

FIG. 22 is a cross-sectional view of the FBC memory device subsequent to FIG. 20. By removing the first sidewall film 47 by using the hot phosphoric acid solution, a hollow is formed as a void 62 under the gate electrode 55.

Figure 23:
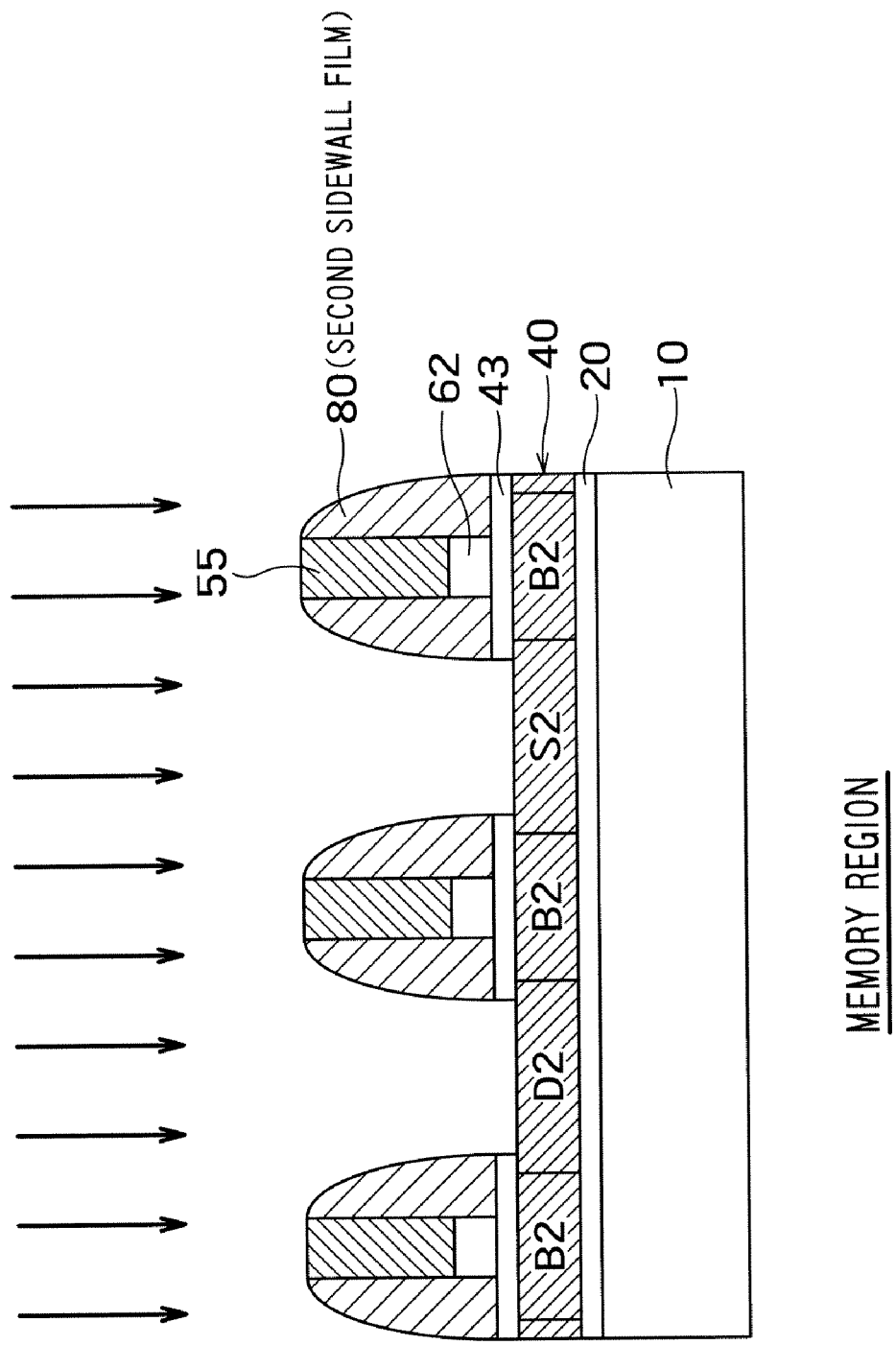
FIG. 23 is a cross-sectional view of the FBC memory device subsequent to FIG. 22.
Figure 24:
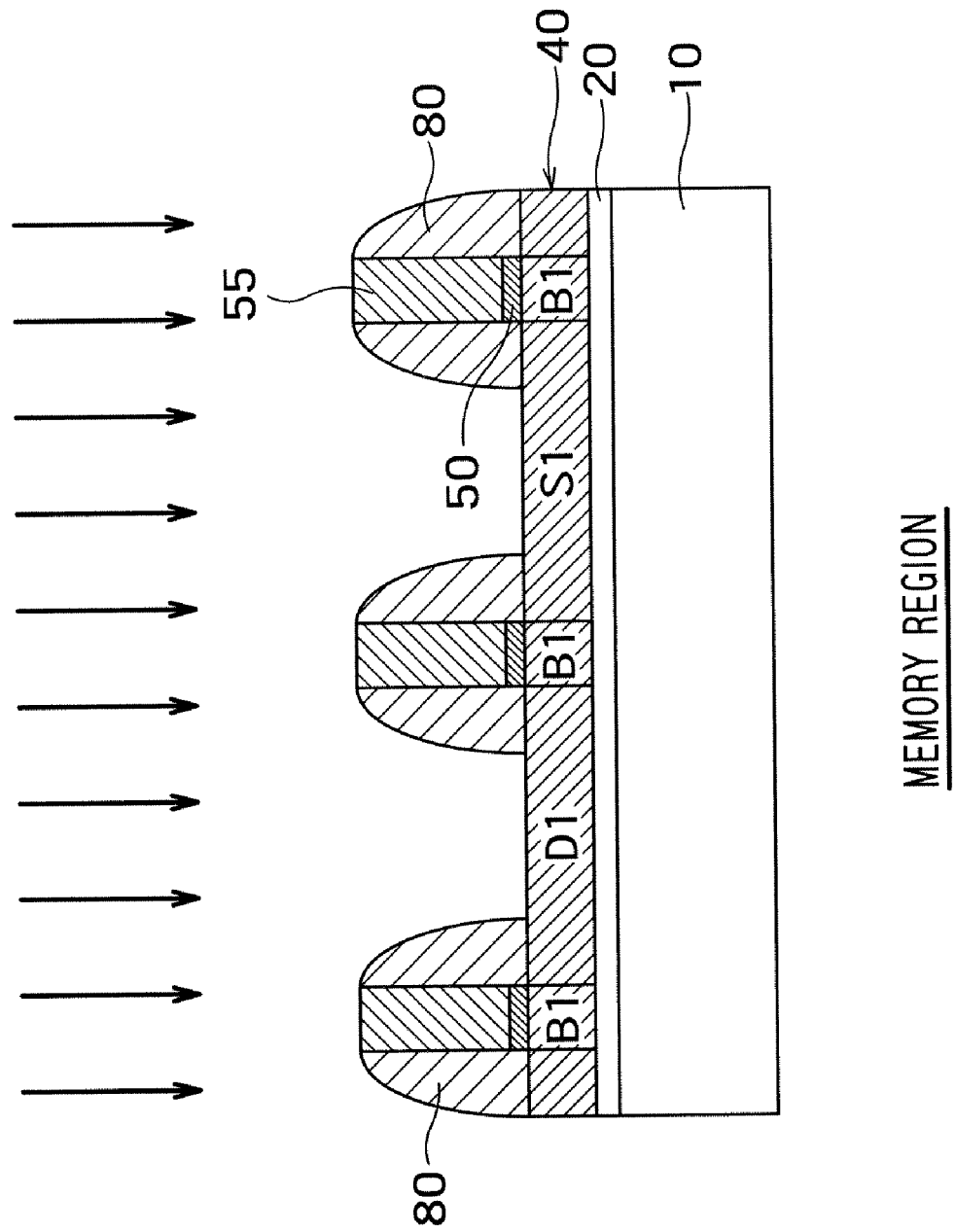
FIG. 24 is a cross-sectional view of the FBC memory device subsequent to FIG. 21.

FIG. 23 is a cross-sectional view of the FBC memory device subsequent to FIG. 22. FIG. 24 is a cross-sectional view of the FBC memory device subsequent to FIG. 21. An insulating film is deposited on the gate electrode 55, the source region, and the drain region. Next, the deposited insulating film is anisotropically etched by the RIE. As a result, as shown in FIGS. 23 and 24, a second sidewall film 80 is formed on a side surface of the gate electrode 55. The second sidewall film 80 is made of, for example, a silicon oxide film or a silicon nitride film.

Next, while the second sidewall film 80 and the gate electrode 55 are used as a mask, arsenic or phosphorus ions are implanted, as N-type impurities, into the source region and the drain region. The arsenic or phosphorus ions are implanted at a dosage of, for example, $5 \times 10^{15}$ cm$^{-2}$ at an acceleration energy of, for example, 2 keV. The second source part S2 and the second drain part D2 are thereby formed. As a result of the implantation step, the width L2 of the second body part B2 between the second drain part D2 and the second source part S2 shown in FIG. 14 is determined.

Figure 25:
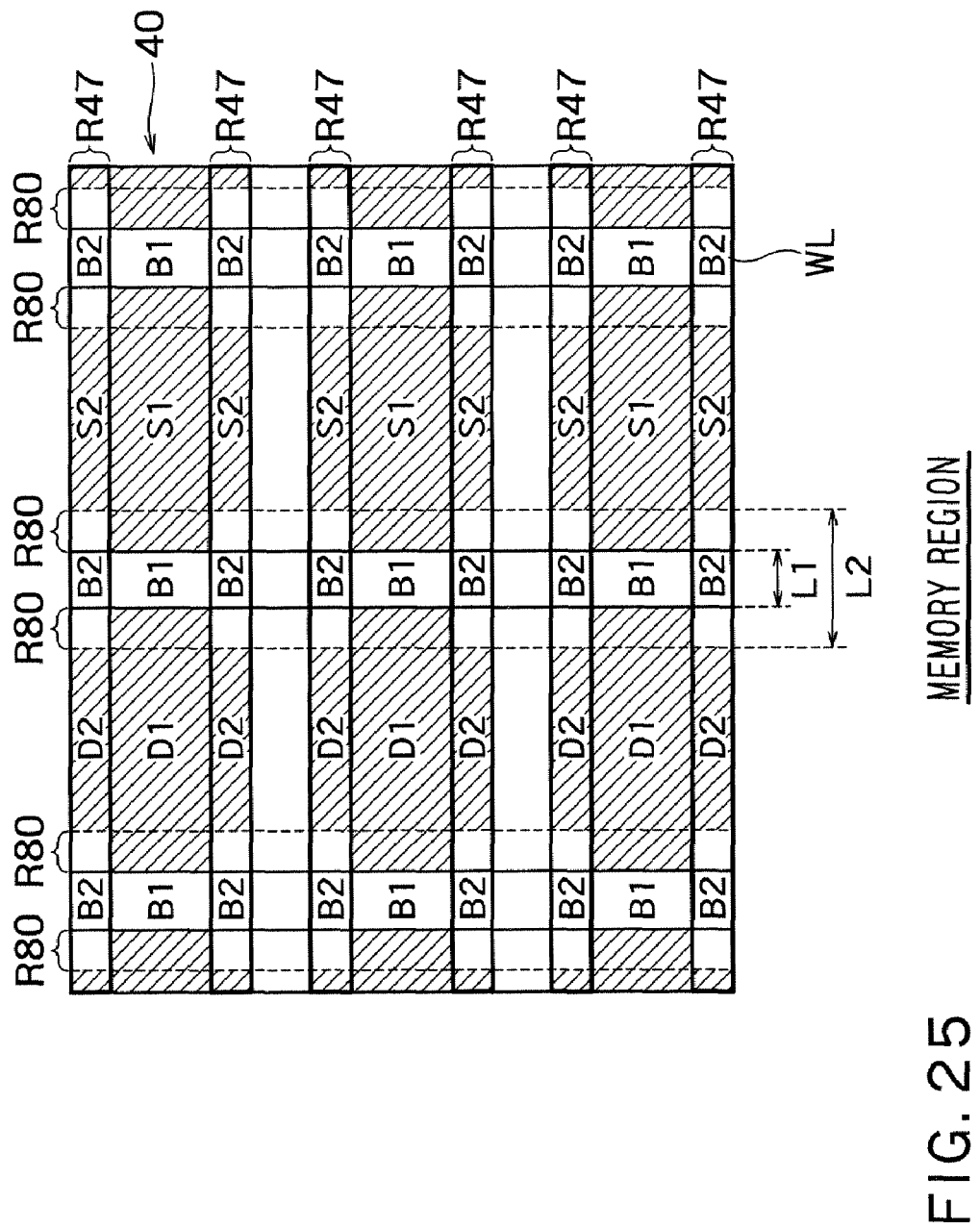
FIG. 25 is a plan view of the FBC memory device, showing the positional relationship between the first sidewall film 47 and the second sidewall film 80.

FIG. 25 is a plan view of the FBC memory device, showing the positional relationship between the first sidewall film 47 and the second sidewall film 80. In FIG. 25, R47 denotes a region in which the first sidewall film 47 is formed, and R80 denotes a region in which the second sidewall film 80 is formed. As can be seen from FIG. 25, the first sidewall film 47 extends along the SOI film 40, and covers up the second body part B2, the second source part S2, and the second drain part D2. It is thereby possible to implant impurities into the first source part S1 and the first drain part D1.

Moreover, the second sidewall film 80 extends along the gate electrode 55, and covers up the SOI layer 40 near the gate electrode 55. It is thereby possible to implant the impurities into the second source part S2 and the second drain part D2.

Thereafter, the silicide layer, the interlayer insulating film, the bit-line contact BLC, the source-line contact SLC, and the like are formed by a conventional process. The FBC memory device according to the third embodiment is thus completed.

Fourth Embodiment

A fourth embodiment of the present invention is a combination of the first and the third embodiments. An FBC memory device according to the fourth embodiment is configured as follows. As shown in FIGS. 2 and 3, the thickness T1 of the first body part B1 is smaller than the thickness T1 of the second body part B2. The thickness is measured in a direction perpendicular to a surface of the BOX layer 20. In addition, as shown in FIG. 14, the width L1 of the first body part B1 is smaller than the width L2 of the second body part B2. Therefore, the fourth embodiment can exhibit both advantages of the first and the third embodiments.

In the fourth embodiment, the second body part B2 having the large thickness is arranged adjacent to the STI region 30, and in addition to it, the first sidewall film 47 having the large thickness is provided on the second body part B2. By doing so, the influence of an electric field from the gate electrode on the second body part B2 is lessened, and the fringing capacitance between the support substrate 10 and the body region is further increased.

Furthermore, by setting the thickness T1 of the first body part B1 having the small gate length smaller, it is possible to suppress rapid reduction of the threshold voltage in a short-channel-length device (a short channel effect). By suppressing the short channel effect, fluctuations in the threshold voltage among the memory cells can be suppressed. As a consequence, it is possible to avoid generation of fail bits.

Figure 26A:
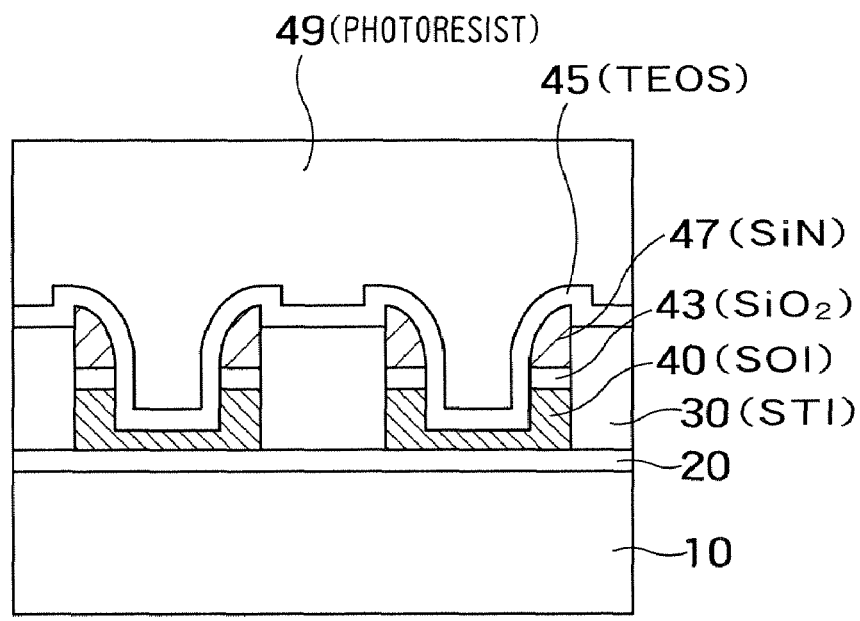
FIGS. 26A and 26B are cross-sectional views showing a method of manufacturing the FBC memory device according to the fourth embodiment.
Figure 26B:
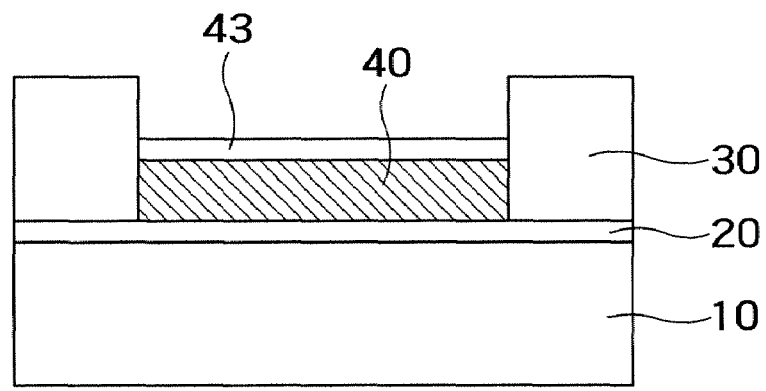

A method of manufacturing the FBC memory device according to the fourth embodiment will be explained. First of all, the steps shown in FIGS. 6A to 8B are executed similarly to the first embodiment. Next, as shown in FIGS. 26A and 26B, the memory region is covered with the resist 49 by the photolithography. The sidewall film 47 serving as the first sidewall film in the logic circuit region is removed.

Figure 27A:
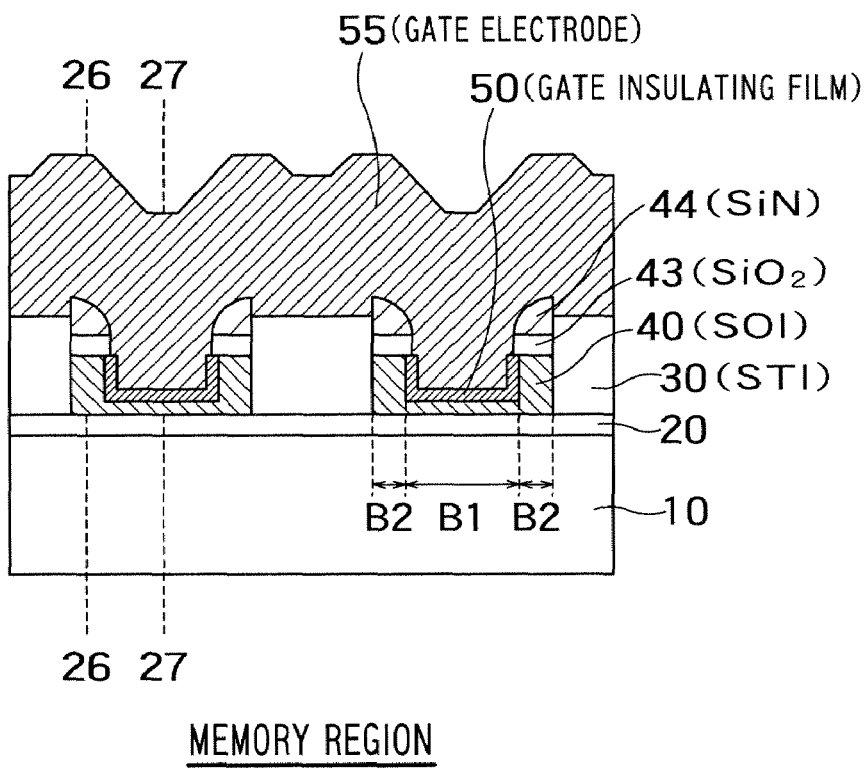
FIGS. 27A and 27B are cross-sectional views showing a method of manufacturing the FBC memory device subsequent to FIGS. 26A and 26B.
Figure 27B:
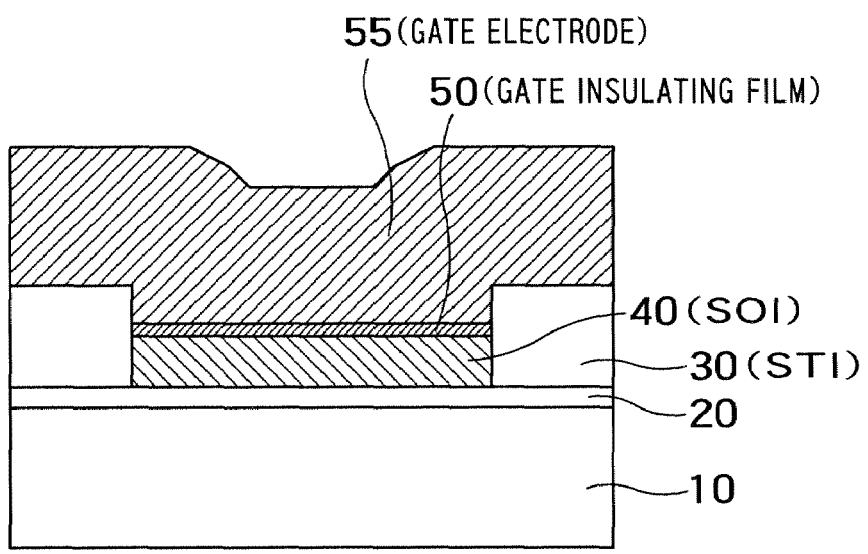

The resist 49 and the TEOS film 45 are removed and, thereafter, as shown in FIGS. 27A and 27B, the gate insulating film 50 is formed on the SOI layer 40 in the first body part B1 that is not covered with the first sidewall film 47. The gate electrode 55 is then formed on the gate insulating film 50. The gate electrode 55 extends in the perpendicular direction to the extension direction of the first sidewall film 47. At the same time, the gate insulating film 50 and the gate electrode 55 may be formed in the logic circuit region. Alternatively, the gate insulating film 50 and the gate electrode 55 may be formed in the logic circuit region at a different step from that of forming the gate insulating film 50 and the gate electrode 55 in the memory region. The thickness of the gate insulating film 50 is, for example, 5 nm. The gate length of the gate electrode 55 is, for example, 50 nm.

Figure 28:
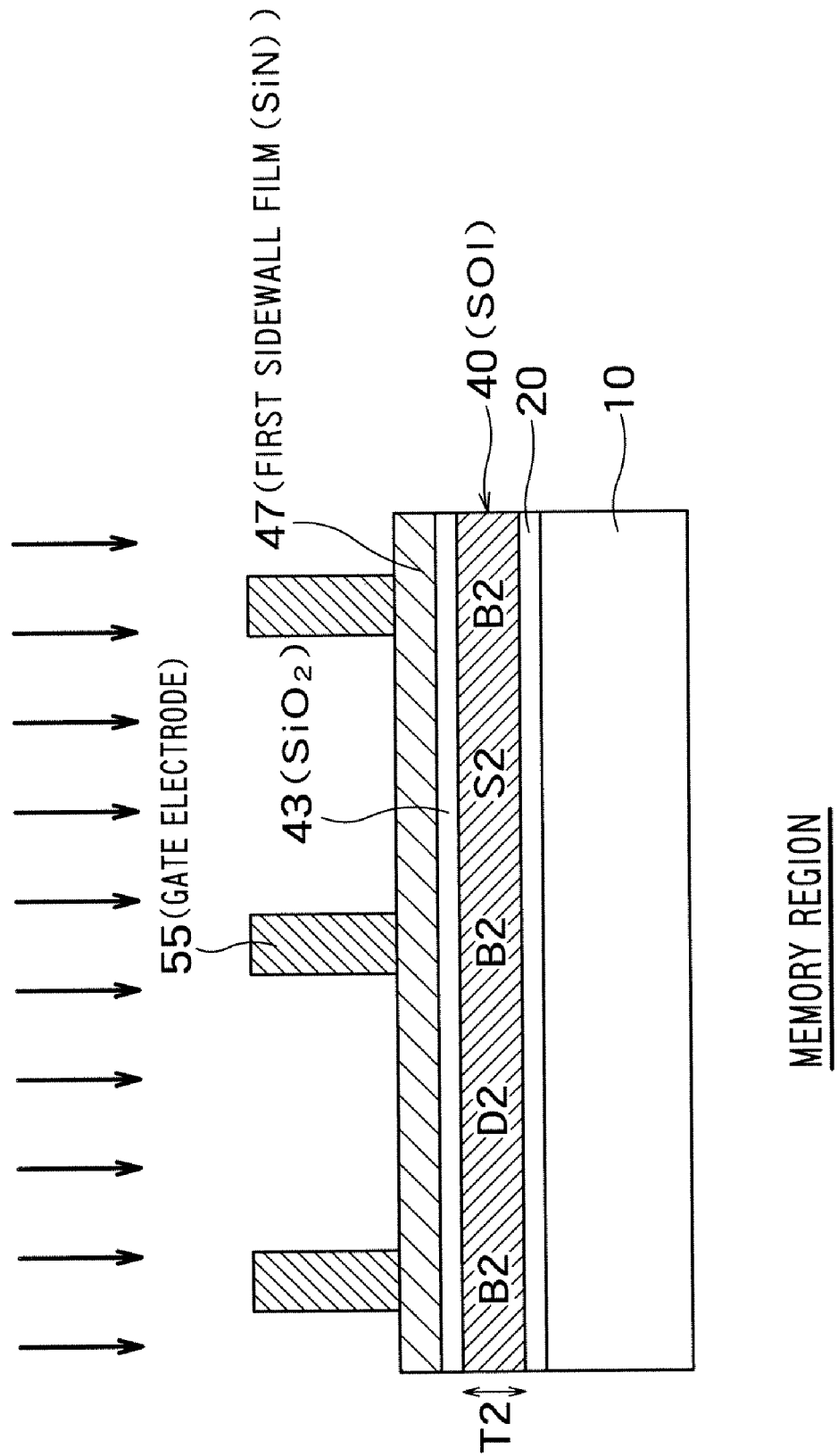
FIG. 28 is a cross-sectional view of the FBC memory device taken along a line 26-26 of FIG. 27A.
Figure 29:
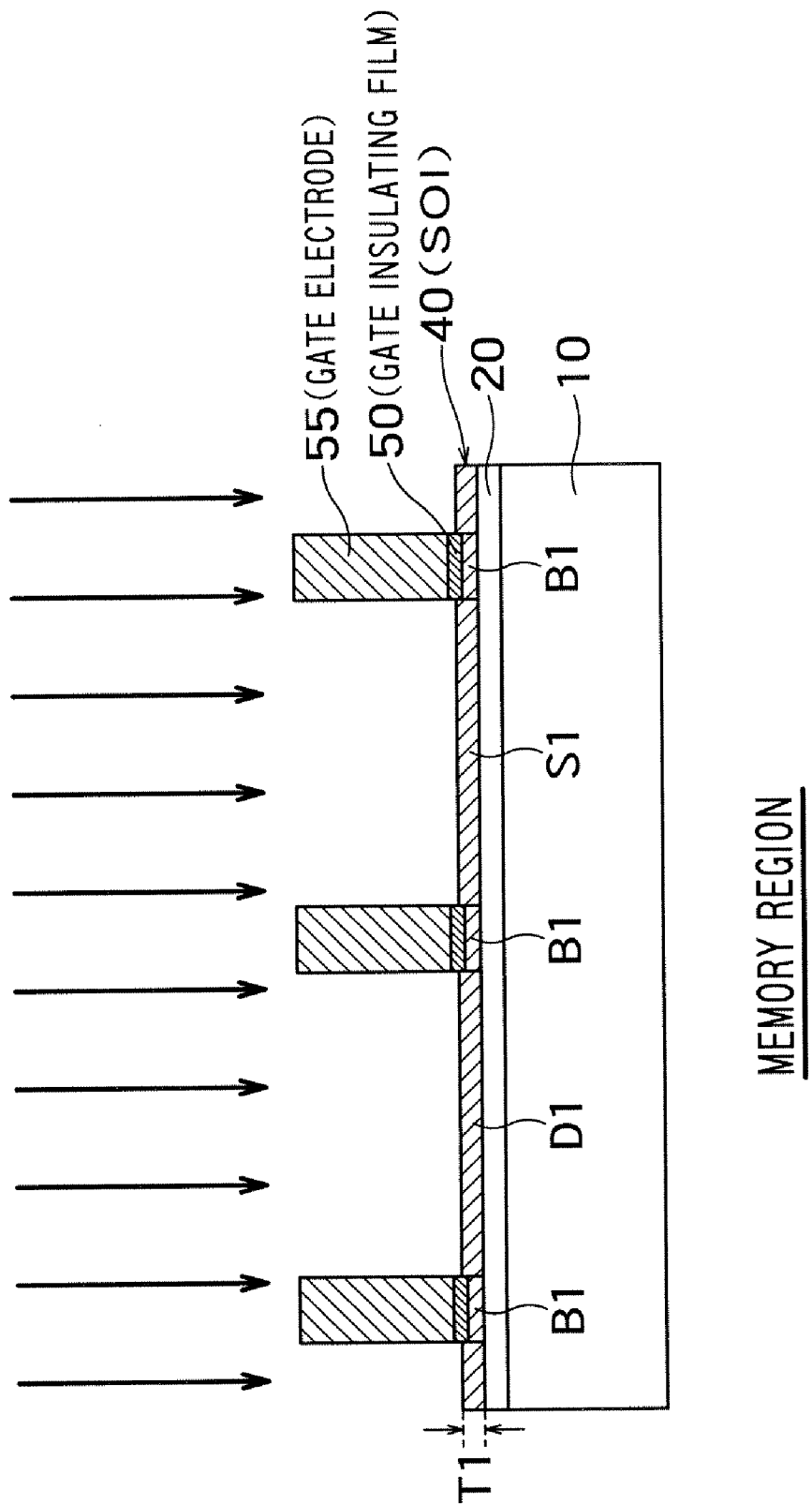
FIG. 29 is a cross-sectional view of the FBC memory device taken along a line 27-27 of FIG. 27A.

FIG. 28 is a cross-sectional view of the FBC memory device taken along a line 26-26 of FIG. 27A. FIG. 29 is a cross-sectional view of the FBC memory device taken along a line 27-27 of FIG. 27A. After forming the gate electrode 55, arsenic or phosphorus ions are implanted, as N-type impurities for formation of a source and a drain, into the source region and the drain region with the gate electrode 55 used as a mask. The arsenic or phosphorus ions are implanted into the source region and the drain region at a dosage of, for example, $1\times10^{13}$ cm$^{-2}$ at an acceleration energy of, for example, 2 keV. The first source part S1 and the first drain part D1 are thereby formed.

At this moment, as shown in FIG. 28, the first sidewall film 47 covers up the second source part S2 and the second drain part D2. The thickness of the first sidewall film 47 is, for example, 50 nm. At the ion implantation step, therefore, no impurities are implanted into the second source part S2 and the second drain part D2. On the other hand, as shown in FIG. 29, the first sidewall film 47 does not cover up the first source part S1 and the first drain part D1. At the ion implantation step, therefore, the impurities are implanted into the first source part S1 and the first drain part D1. As a result of the ion implantation step, the width L1 of the first body part B1 between the first drain part D1 and the first source part S1 shown in FIG. 14 is determined.

Figure 30:
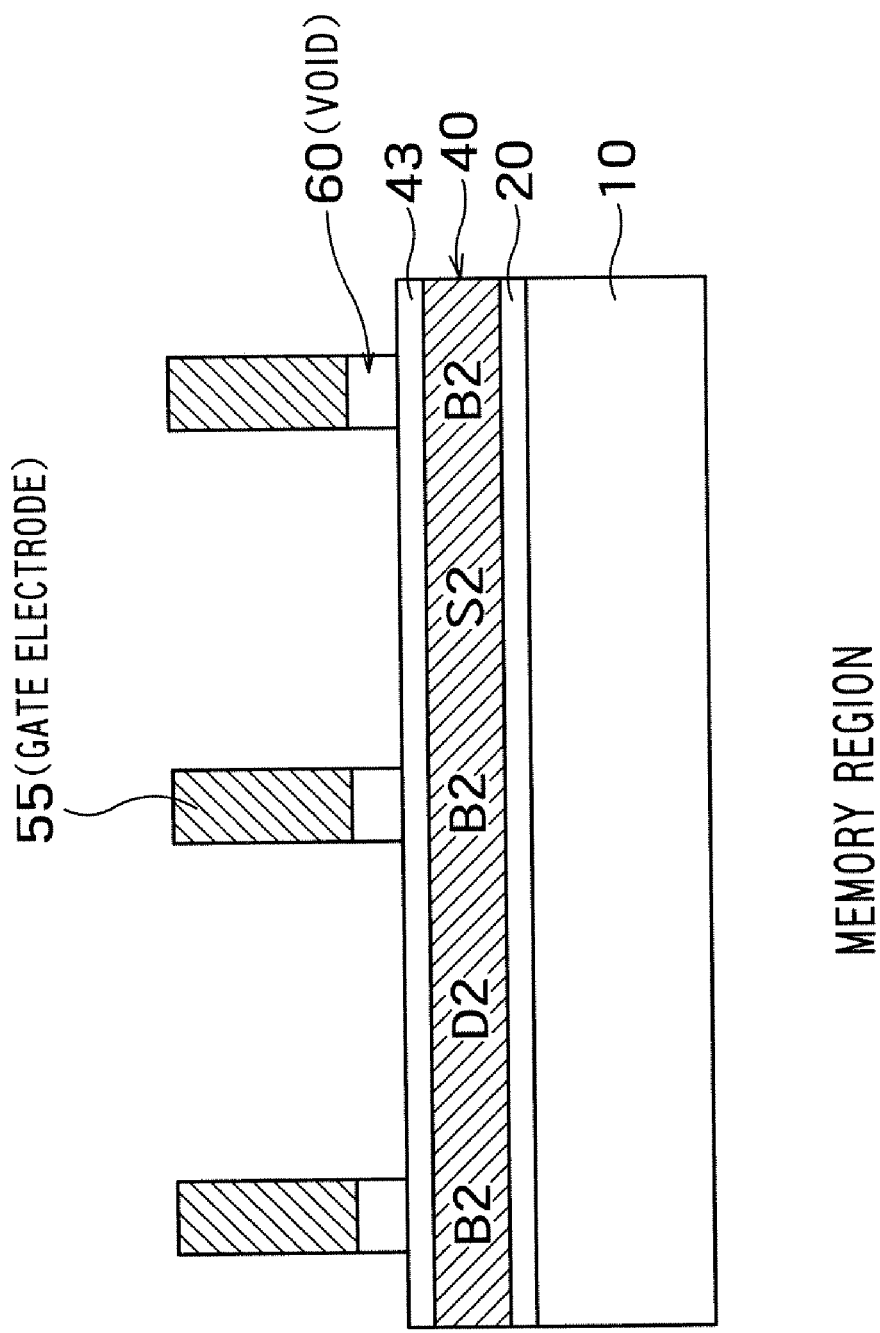
FIG. 30 is a cross-sectional view of the FBC memory device subsequent to FIG. 28.

FIG. 30 is a cross-sectional view of the FBC memory device subsequent to FIG. 28. By removing the first sidewall film 47 by using the hot phosphoric acid solution, a hollow is formed as the void 62 under the gate electrode 55.

Figure 31:
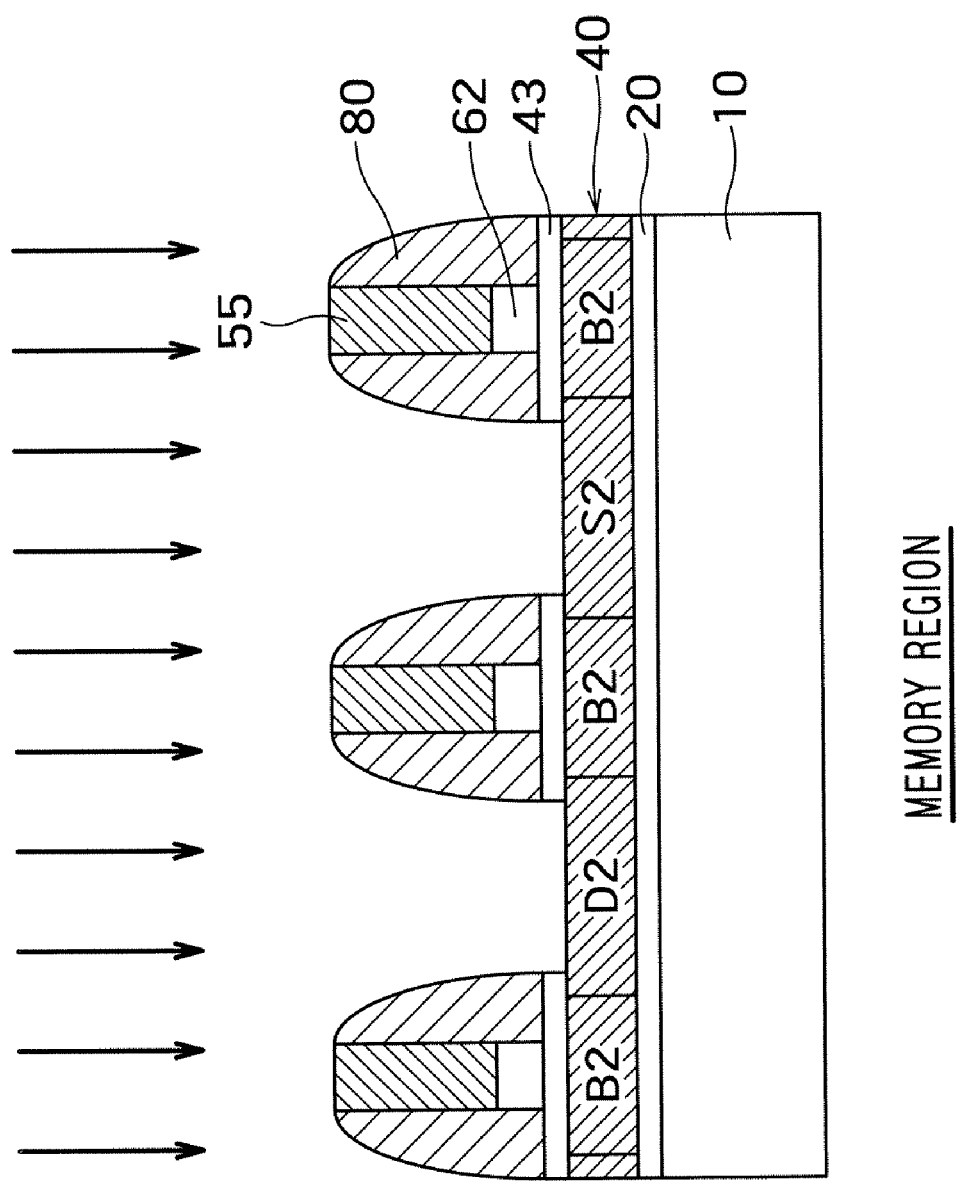
FIG. 31 is a cross-sectional view of the FBC memory device subsequent to FIG. 30.
Figure 32:
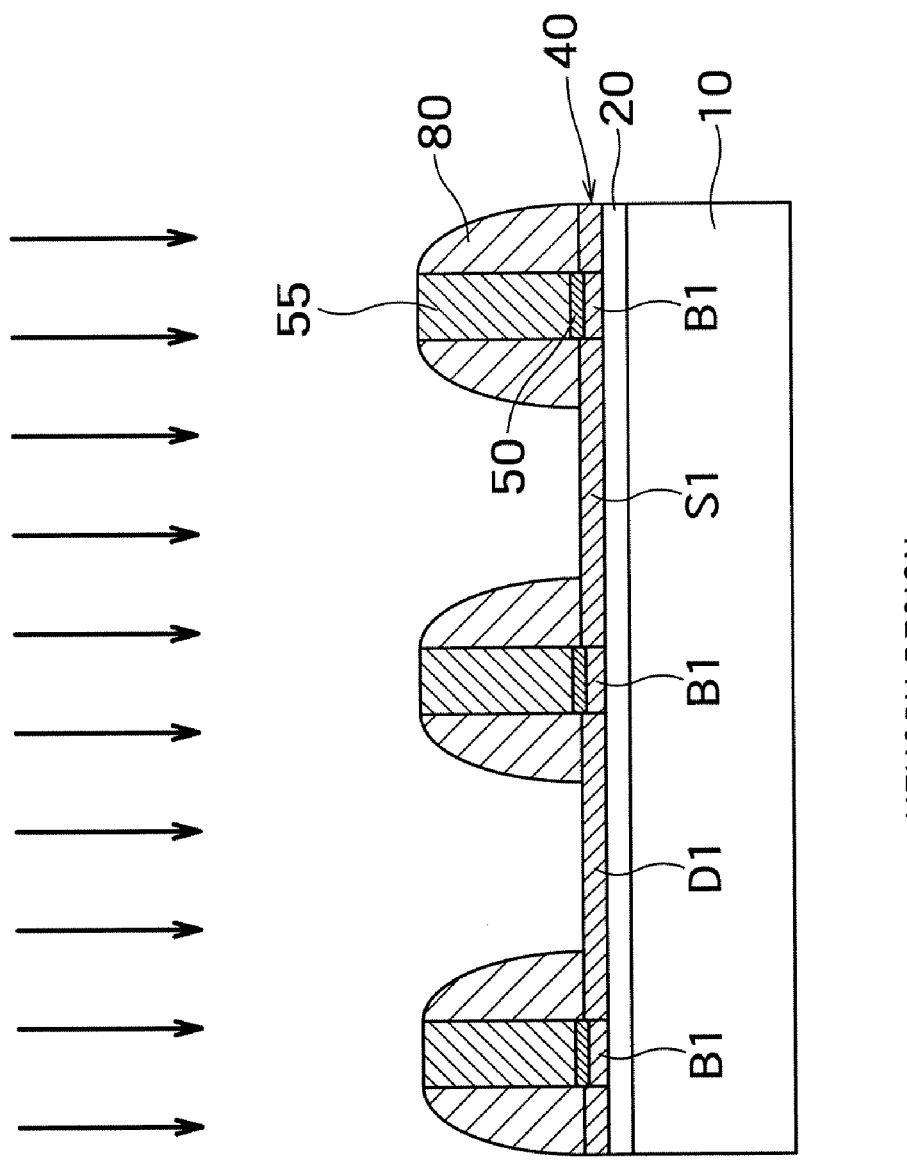
FIG. 32 is a cross-sectional view of the FBC memory device subsequent to FIG. 29.

FIG. 31 is a cross-sectional view of the FBC memory device subsequent to FIG. 30. FIG. 32 is a cross-sectional view of the FBC memory device subsequent to FIG. 29. An insulating film is deposited on the gate electrode 55, the source region, and the drain region. Next, the deposited insulating film is anisotropically etched by the RIE. As a result, as shown in FIGS. 30 and 31, the second sidewall film 80 is formed on the side surface of the gate electrode 55. The second sidewall film 80 is made of, for example, a silicon oxide film or a silicon nitride film.

Next, while the second sidewall film 80 and the gate electrode 55 are used as a mask, arsenic or phosphorus ions are implanted, as N-type impurities, into the source region and the drain region. The arsenic or phosphorus ions are implanted into the source and drain layers S and D at a dosage of, for example, $5\times10^{15}$ cm$^{-2}$ at an acceleration energy of, for example, 2 keV. The second source part S2 and the second drain part D2 are thereby formed. As a result of the implantation step, the width L2 of the second body part B2 between the second drain part D2 and the second source part S2 shown in FIG. 14 is determined.

Thereafter, the silicide layer, the interlayer insulating film, the bit-line contact BLC, the source-line contact SLC, and the like are formed by a conventional process. The FBC memory device according to the third embodiment is thus completed. It is to be noted that the positional relationship between the first sidewall film 47 and the second sidewall film 80 is the same as that shown in FIG. 25.

Modification of Manufacturing Method According to Fourth Embodiment

Figure 33:
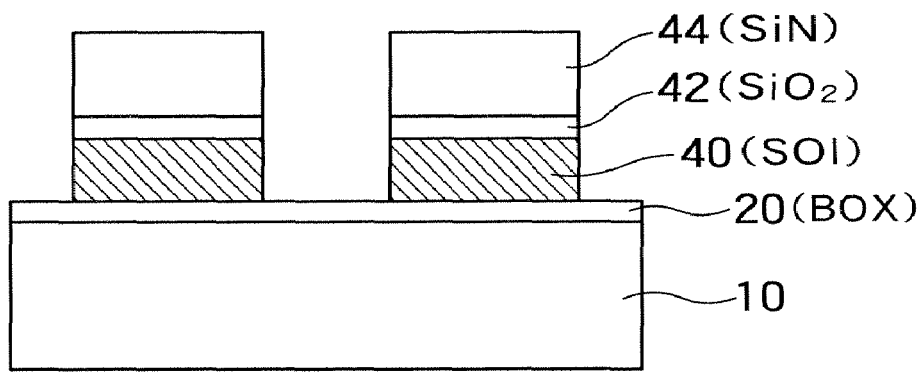
FIG. 33 is are cross-sectional views showing a manufacturing method of the FBC memory device according to a modification of the fourth embodiment.
Figure 34:
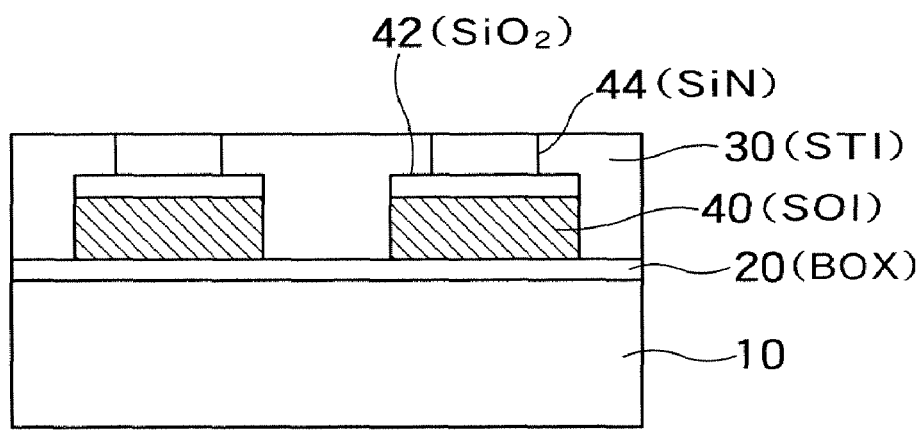
FIG. 34 is a cross-sectional view of the FBC memory device subsequent to FIG. 33.

First, similarly to the first embodiment, a trench is formed in the element isolation region. A structure shown in FIG. 33 is obtained accordingly. The silicon nitride film 44 is then isotropically etched by about 30 nm by the hot phosphoric acid solution. A silicon oxide film is then deposited and flattened by chemical-mechanical polishing (CMP), thereby forming the STI region 30 as shown in FIG. 34.

Figure 35:
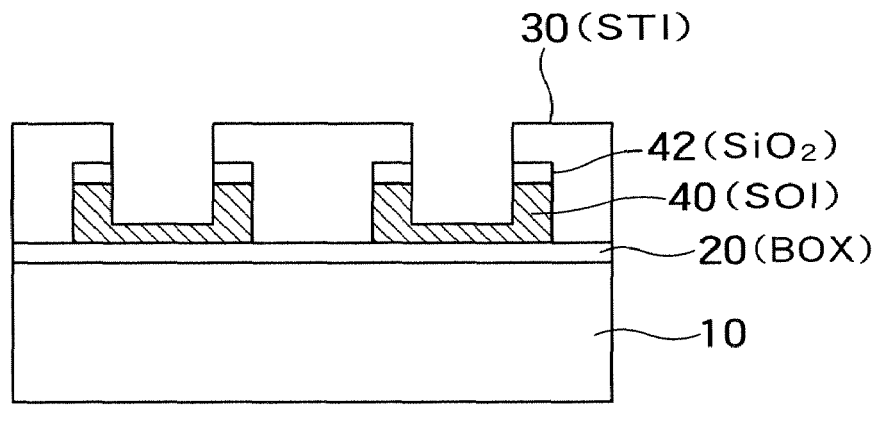
FIG. 35 is a cross-sectional view of the FBC memory device subsequent to FIG. 34.

After removing the silicon nitride film 44 by the hot phosphoric acid solution, the silicon oxide film 42 and the SOI layer 40 in the central portion of the body region are anisotropically etched by using STI 30 as a mask. As a result, a structure shown in FIG. 35 is obtained. In FIG. 35, the etched thin SOI layer 40 serves as the first body part B1 whereas the unetched thick SOI layer 40 serves as the second body part B2.

Figure 36:
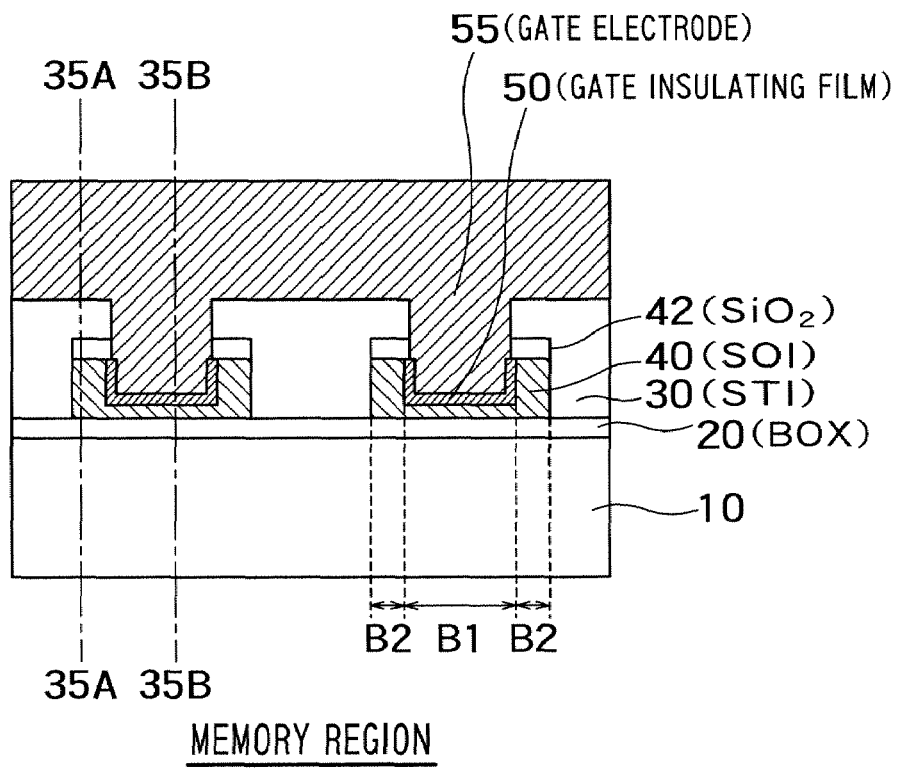
FIG. 36 is a cross-sectional view of the FBC memory device subsequent to FIG. 35.

Next, boron ions at a concentration of $1\times10^{18}$ cm$^{-3}$ are implanted into the SOI layer 40. Furthermore, as shown in FIG. 36, the gate insulating film 50 and the gate electrode 55 are formed. Using the gate electrode 55 as a mask, arsenic or phosphorus ions are implanted, as N-type impurities for forming the source and the drain, into the source region and the drain region at a dosage of, for example, $1\times10^{13}$ cm$^{-2}$ at an acceleration energy of, for example, 2 keV. The first source part S1 and the first drain part D1 are thereby formed.

Figure 37A:
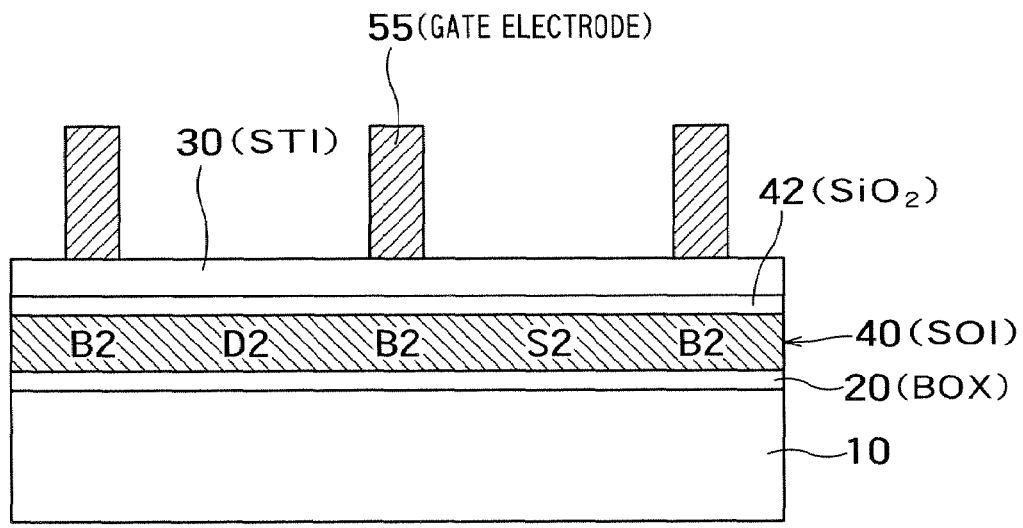
FIG. 37A is a cross-sectional view of the FBC memory device taken along a line 35A-35A of FIG. 36.
Figure 37B:
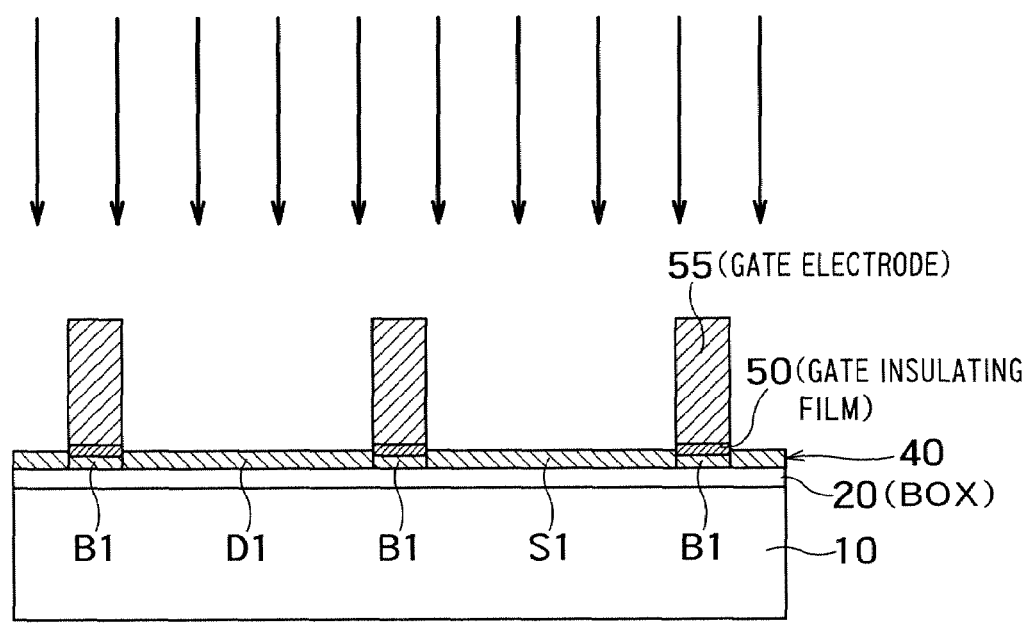
FIG. 37B is a cross-sectional view of the FBC memory device taken along a line 35B-35B of FIG. 36.

At this moment, as shown in FIG. 37A, the STI 30 and the silicon oxide film 42 cover up the second source part S2 and the second drain part D2. The thicknesses of the STI 30 and the silicon oxide film 42 are, for example, 50 nm. At the ion implantation step, therefore, no impurities are implanted into the second source part S2 and the second drain part D2. On the other hand, as shown in FIG. 37B, the STI 30 and the silicon oxide film 42 do not cover up the first source part S1 and the first drain part D1. At the ion implantation step, therefore, the impurities are implanted into the first source part S1 and the first drain part D1. As a result of the ion implantation step, the width L1 of the first body part B1 between the first drain part D1 and the first source part S1 shown in FIG. 14 is determined.

In a modification of the fourth embodiment, the STI region 30 and the silicon oxide film 42 on the second body part B2 correspond to the first sidewall film 47 in the third embodiment. This makes it unnecessary to separately execute the sidewall film deposition step and the like. The manufacturing method in the modification can reduce a manufacturing cost of the device, as compared with the third and the fourth embodiments.

FIG. 37A is a cross-sectional view of the FBC memory device taken along a line 35A-35A of FIG. 36. FIG. 37 shows cross sections of the second body part B2, the second source part S2, and the second drain part D2 cut in the extension direction of the STI region 30 and the SOI layer 40. Therefore, the cross sections of B2, D2, B2, S2, B2, D2, and so on appear in FIG. 37 in that order. FIG. 37B is a cross-sectional view of the FBC memory device taken along a line 35B-35B of FIG. 36. FIG. 37B shows cross sections of the first body part B1, the first source part S1, and the first drain part D1 in the extension direction of the STI region 30 and the SOI layer 40. Therefore, the cross sections of B1, D1, B1, S1, B1, D1, and so on appear in FIG. 37B in that order.

Comparison of FIG. 37A with FIG. 37B shows the following respect. At the ion implantation step, the impurities are implanted not into the second body part B2 but into the first body part B1.

Figure 38A:
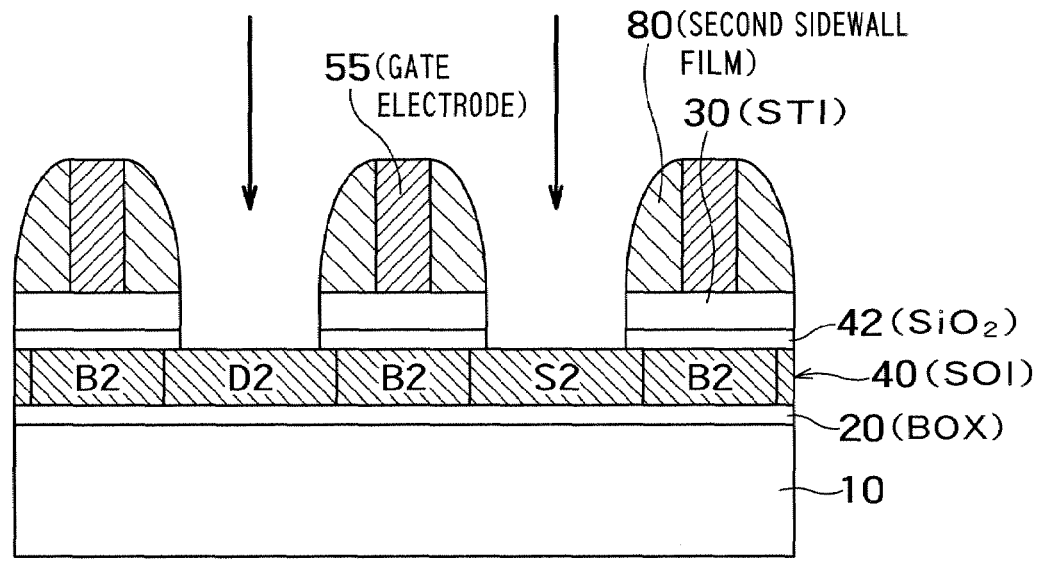
FIGS. 38A and 38B are cross-sectional views of the FBC memory device, showing the manufacturing method subsequent to FIGS. 37A and 37B, respectively.
Figure 38B:
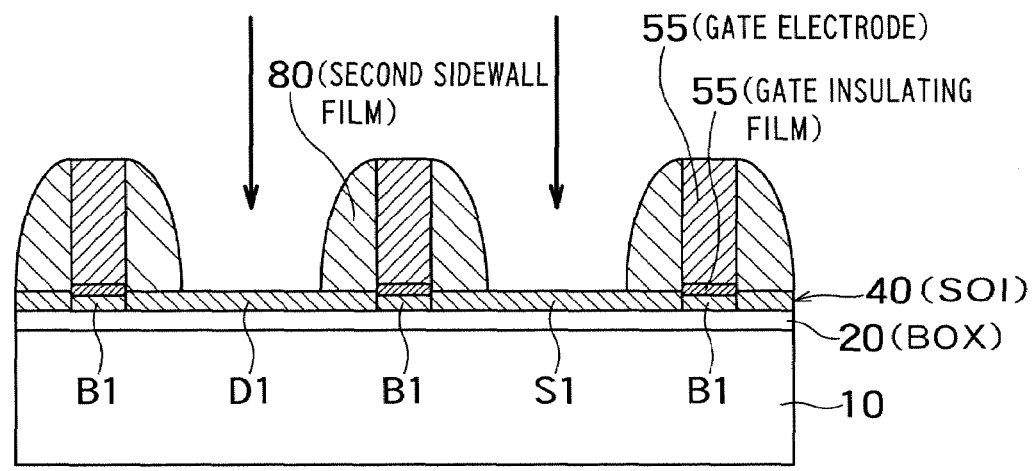

FIGS. 38A and 38B are cross-sectional views of the FBC memory device, showing the manufacturing method subsequent to FIGS. 37A and 37B, respectively. After N-type impurities are implanted into the first body part B1, an insulating film is deposited on the gate electrode 55, the source region, and the drain region. The deposited insulating film is anisotropically etched by the RIE. As a result, the second sidewall film 80 is formed on the side surface of the gate electrode 55 as shown in FIGS. 38A and 38B. The second sidewall film 80 is made of, for example, a silicon oxide film or a silicon nitride film.

Next, using the second sidewall film 80 and the gate electrode 55 as mask materials, arsenic or phosphorus ions are implanted, as N-type impurities, into the source region and the drain region. The arsenic or phosphorus ions are implanted into the source and drain layers S and D at a dosage of, for example, $5\times10^{15}$ cm$^{-2}$ at an acceleration energy of, for example, 2 keV. The second source part S2 and the second drain part D2 are thereby formed. As a result of the implantation step, the width L2 of the second body part B2 between the second drain part D2 and the second source part S2 shown in FIG. 14 is determined.

Thereafter, the silicide layer, the interlayer insulating film, the bit-line contact BLC, the source-line contact SLC, and the like are formed by a conventional process similarly to the fourth embodiment. The FBC memory device according to the present modification is thus completed.

Fifth Embodiment

Figure 39:
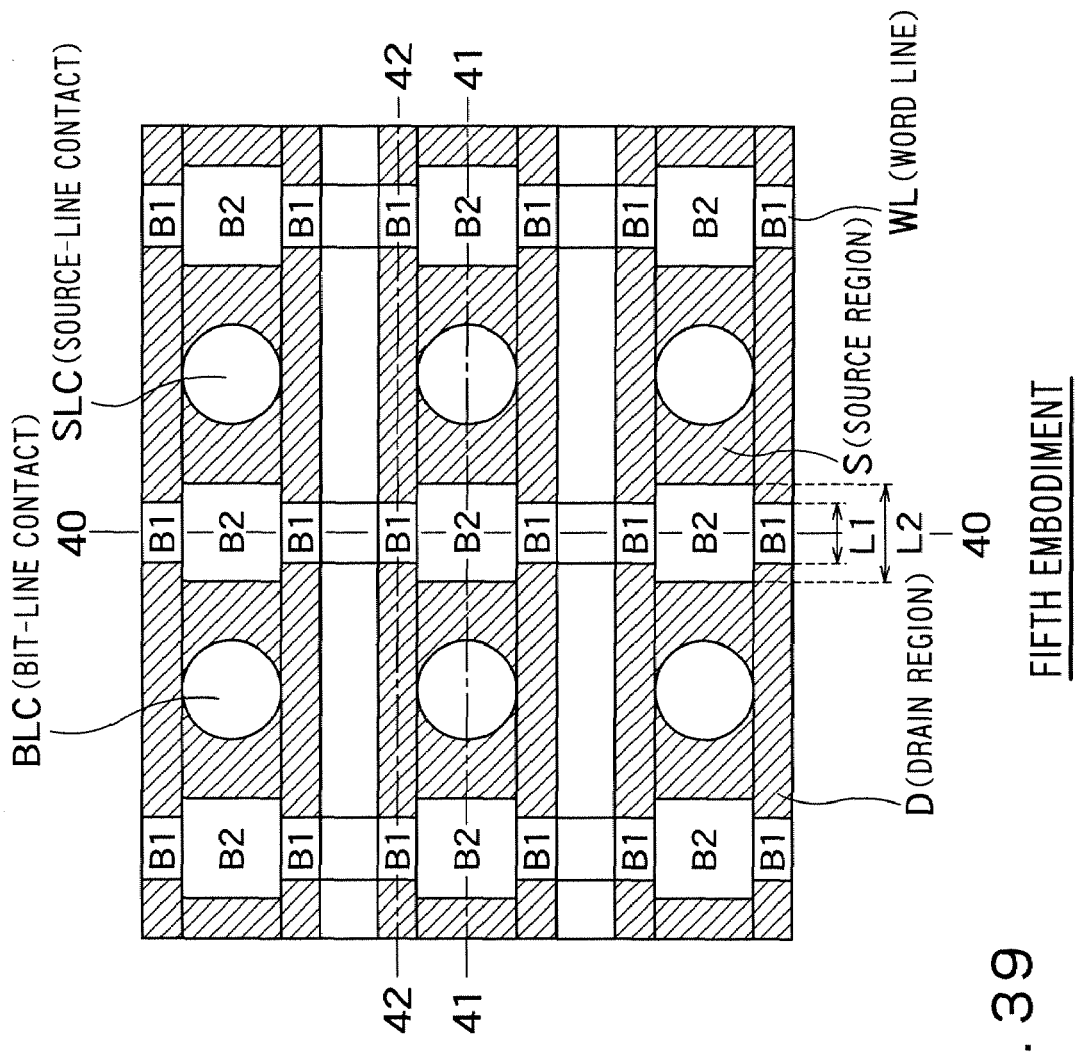
FIG. 39 is a plan view of an FBC memory device according to a fifth embodiment.

FIG. 39 is a plan view of an FBC memory device according to a fifth embodiment of the present invention. In the fifth embodiment, similarly to the third embodiment, the width L1 of the first body part B1 located between the first source part S1 and the first drain part D1 differs from the width L2 of the second body part B2 located between the second source part S2 and the second drain part D2. In the fifth embodiment, differently from the third embodiment, the first body part B1 having the smaller width L1 is arranged adjacent to the STI region 30.

Figure 40:
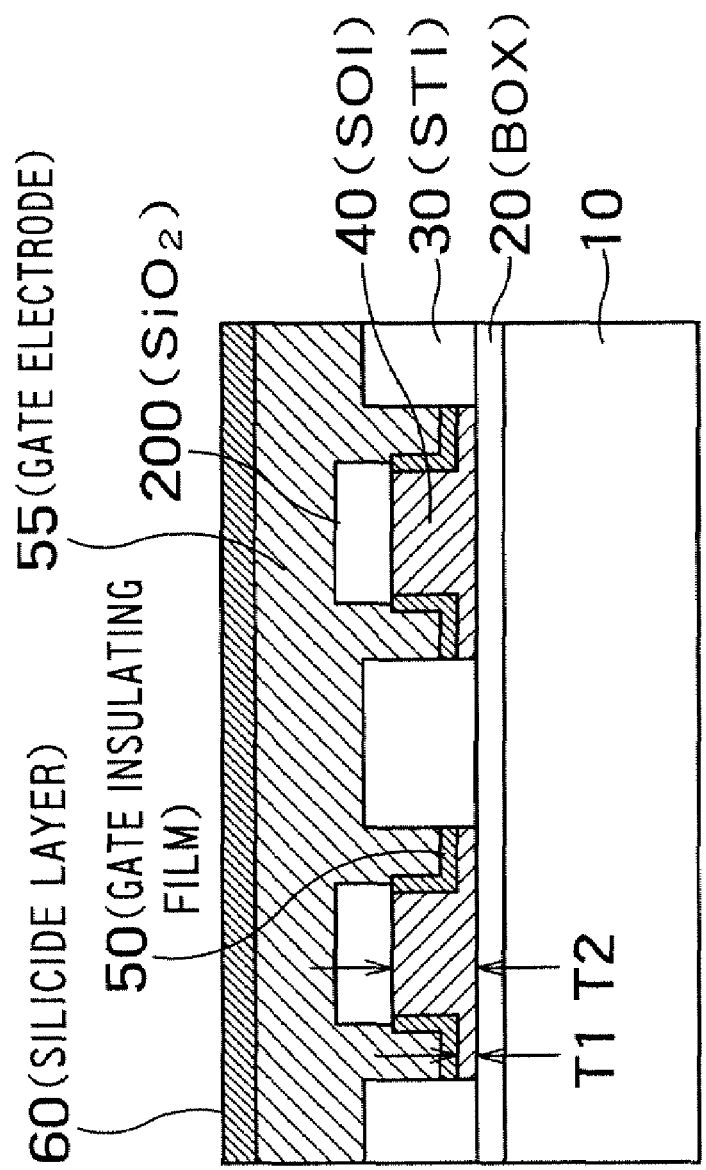
FIG. 40 is a cross-sectional view of the FBC memory device taken along a line 40-40 of FIG. 39.
Figure 41:
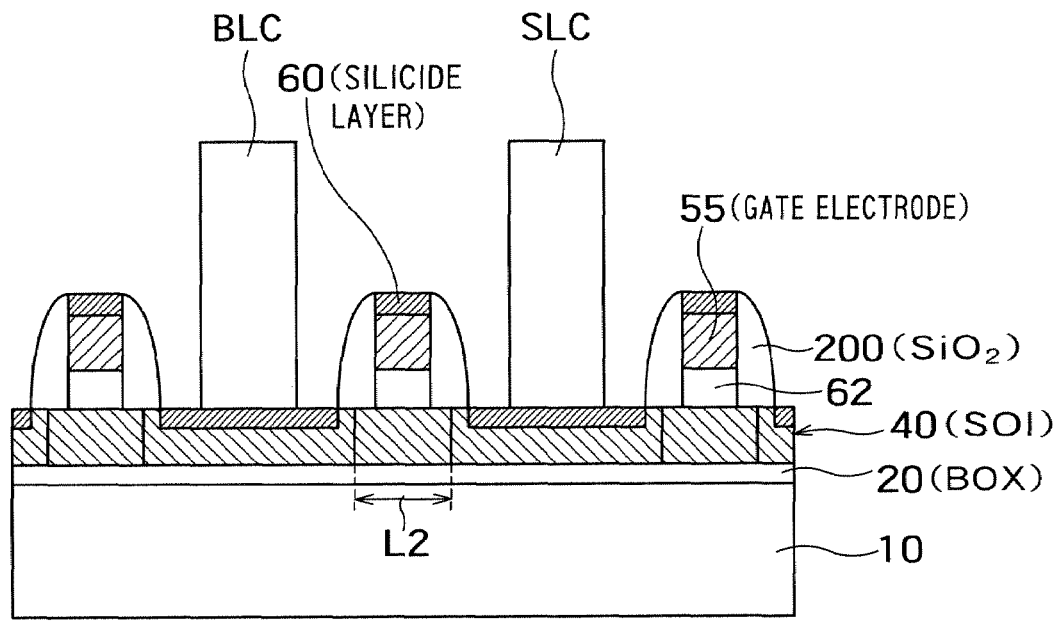
FIG. 41 is a cross-sectional view of the FBC memory device taken along a line 41-41 of FIG. 39.
Figure 42:
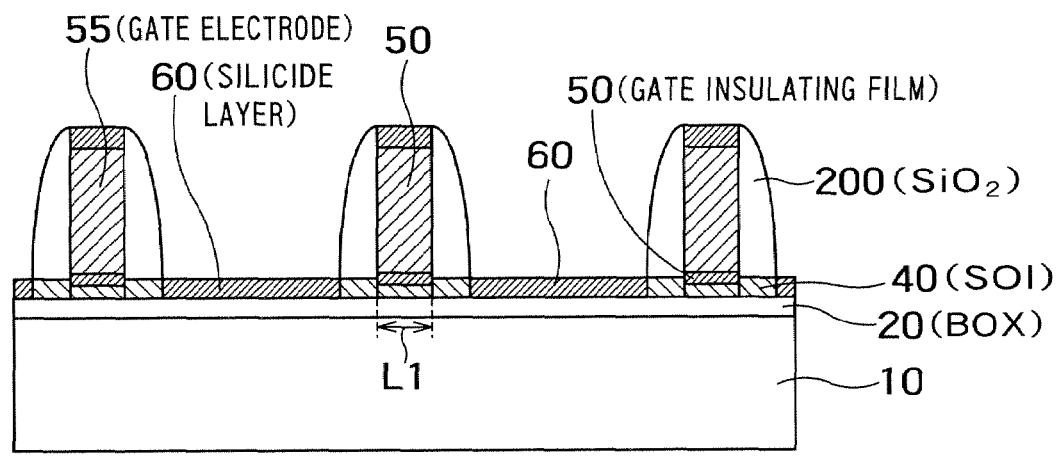
FIG. 42 is a cross-sectional view of the FBC memory device taken along a line 42-42 of FIG. 39.

FIG. 40 is a cross-sectional view of the FBC memory device taken along a line 40-40 of FIG. 39. FIG. 41 is a cross-sectional view of the FBC memory device taken along a line 41-41 of FIG. 39. FIG. 42 is a cross-sectional view of the FBC memory device taken along a line 42-42 of FIG. 39. As shown in FIG. 40, the thickness T1 of the first body part B1 differs from the thickness T2 of the second body part B2. The thickness is measured in a direction perpendicular to a surface of the BOX layer 20. In the fifth embodiment, the first body part B1 having the smaller thickness T1 is arranged adjacent to the STI region 30.

In the fifth embodiment, it is possible to increase the body effect coefficient and increase the body potential difference ΔVB, as compared with the conventional technique. However, as compared with the fourth embodiment, the capacity between the body region and the support substrate 10 with respect to a fringing capacity is small.

Figure 43A:
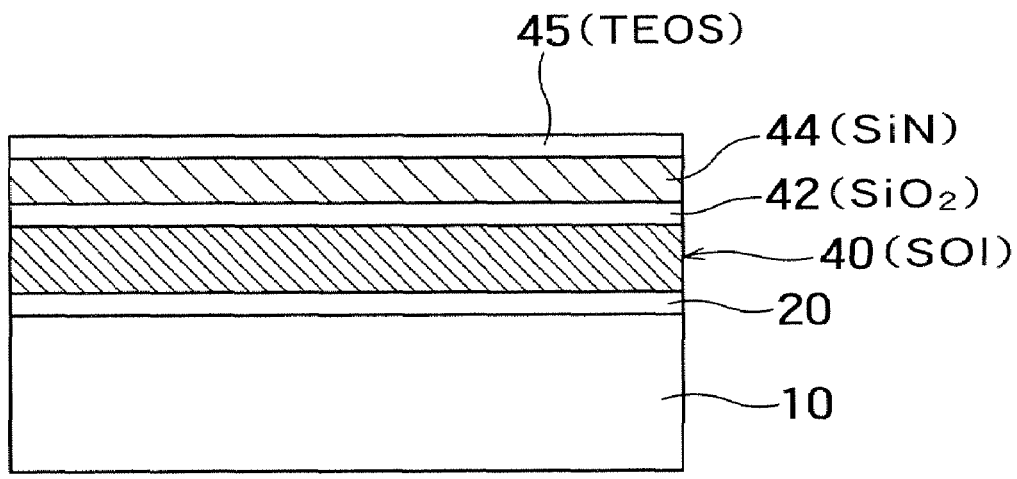
FIGS. 43A, 43B, 44A, 44B, 45A, 45B, 46A, 46B, 47A, 47B, 48A, 48B, 49A, 49B, and 50 are cross-sectional views of the FBC memory device, showing a method of manufacturing the FBC memory device according to the fifth embodiment.
Figure 43B:
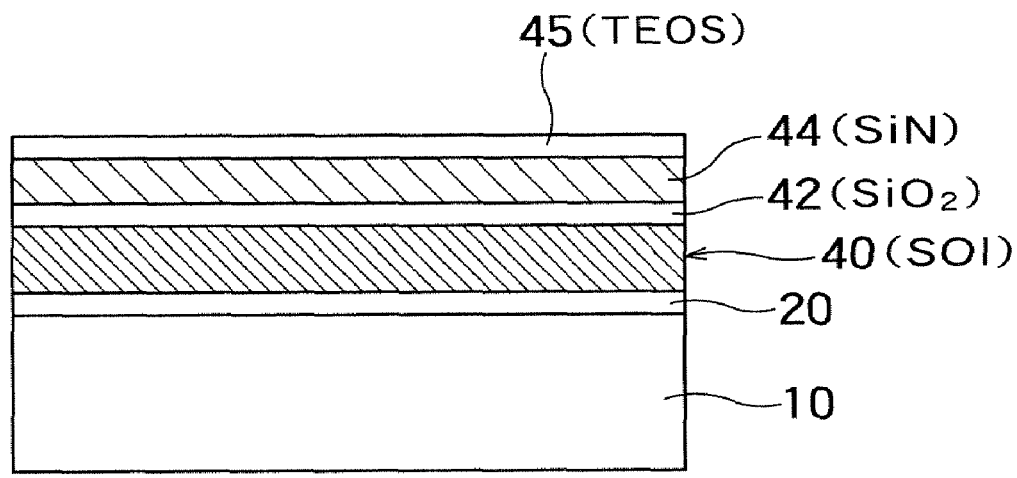

FIGS. 43A to 52 are cross-sectional views of the FBC memory device, showing a method of manufacturing the FBC memory device according to the fifth embodiment. First of all, the SOI substrate including the support substrate 10, the BOX layer 20, and the SOI layer 40 is prepared. By oxidizing a surface of the SOI layer 40, the silicon oxide film 42 is formed. Next, the silicon nitride film 44 and the TEOS film 45 are deposited on the silicon oxide film 42 in this order. As a result, a structure shown in FIGS. 43A and 43B is obtained. The thickness of the silicon nitride film 44 is, for example, 50 nm.

Figure 44A:
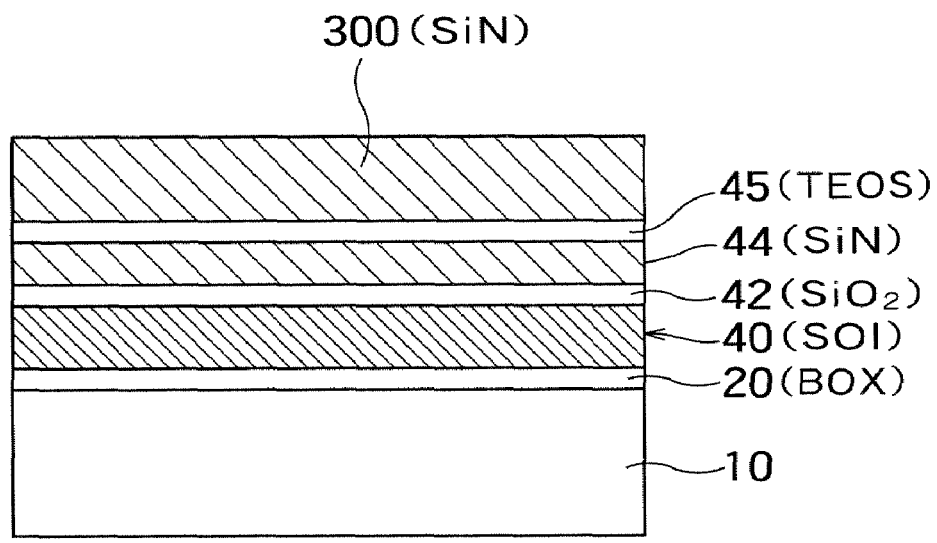
Figure 44B:
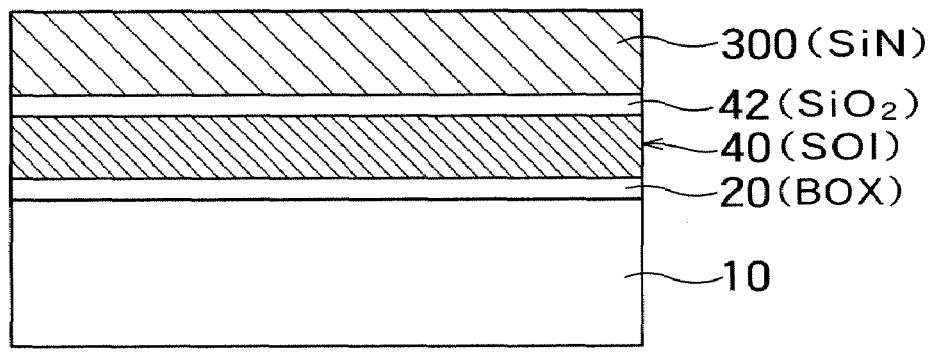

As shown in FIG. 44B, the TEOS film 45 and the silicon nitride film 44 in the logic circuit region are removed by the photolithography and the wet etching. As shown in FIGS. 44A and 44B, a silicon nitride film 300 is deposited.

Figure 45A:
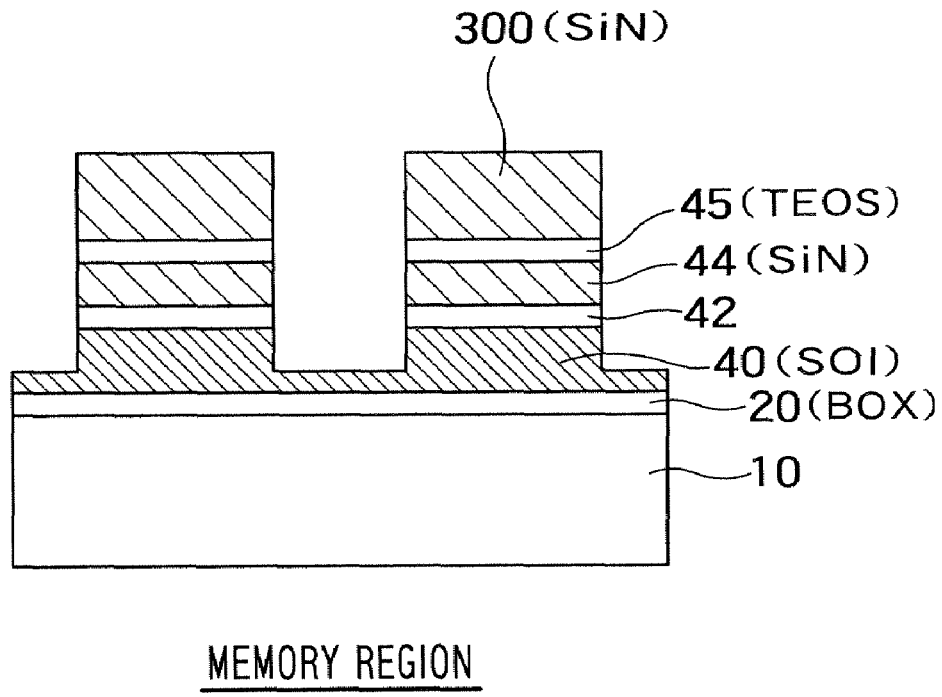
Figure 45B:
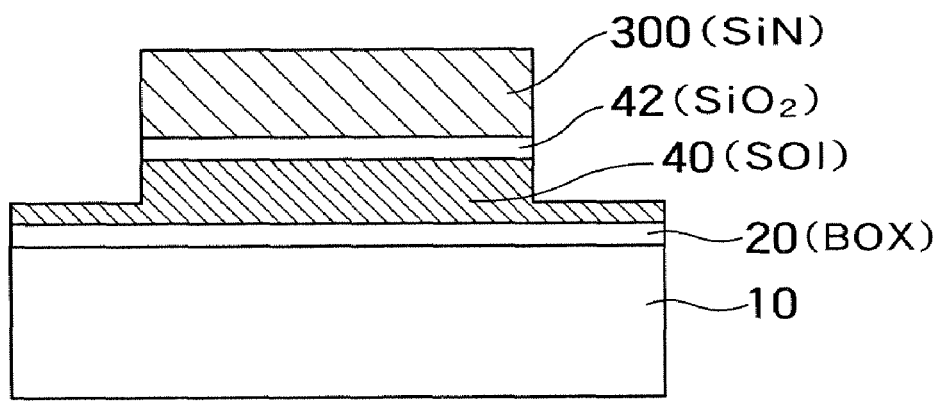

As shown in FIGS. 45A and 45B, the mask materials in the element isolation region are removed and the SOI layer 40 is etched halfway by the photolithography and the anisotropic etching.

Figure 46A:
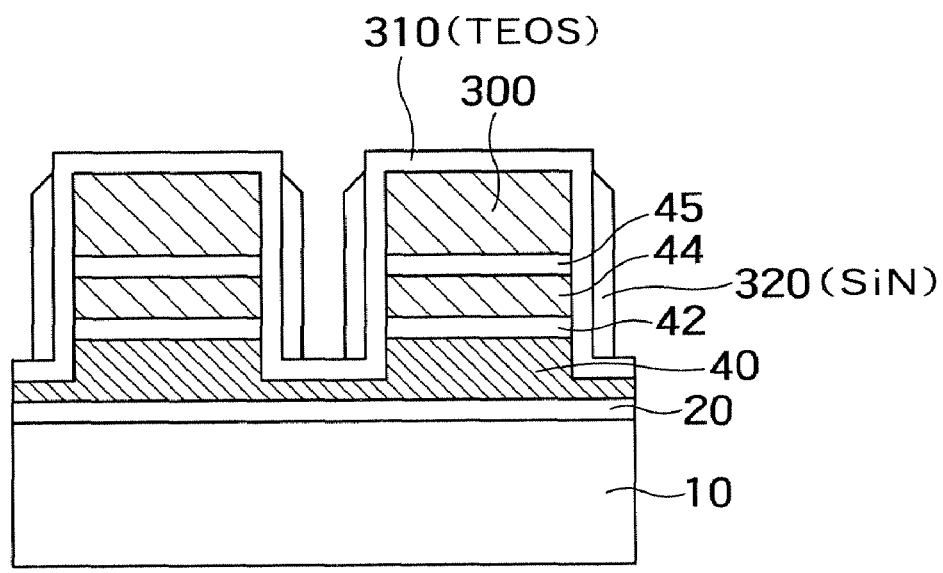
Figure 46B:
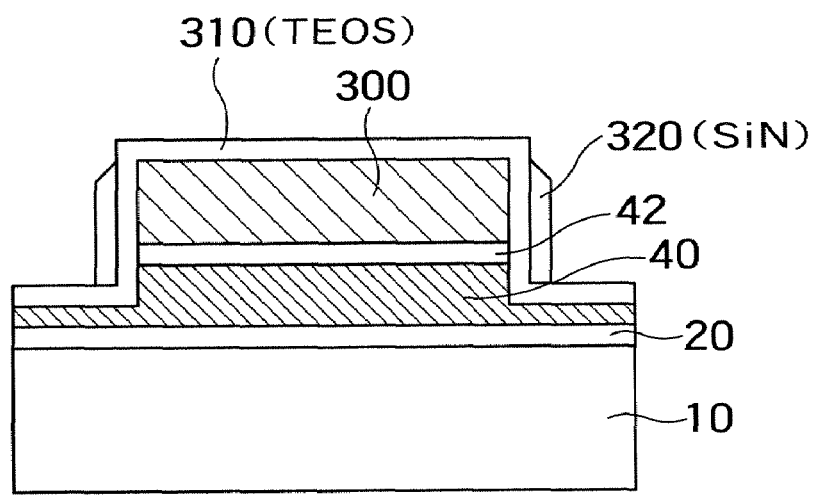

Next, a TEOS film 310 and a silicon nitride film 320 are deposited. A thickness of the TEOS film 310 is, for example, about 10 nm. A thickness of the silicon nitride film 320 is, for example, 30 nm. Thereafter, the silicon nitride film 320 is anisotropically etched. As a result, as shown in FIGS. 46A and 46B, the silicon nitride film 320 is left, as a sidewall film, on a side surface of the TEOS film 310.

Figure 47A:
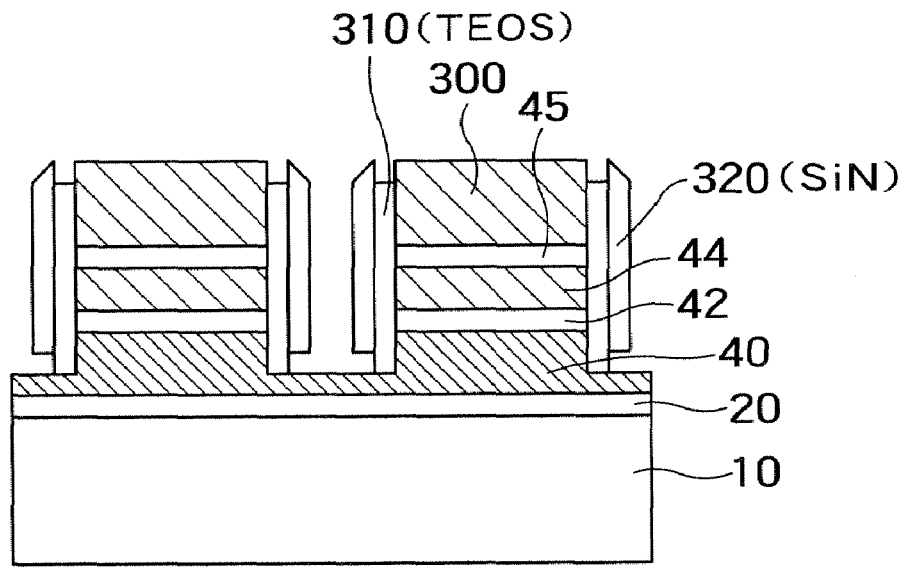
Figure 47B:
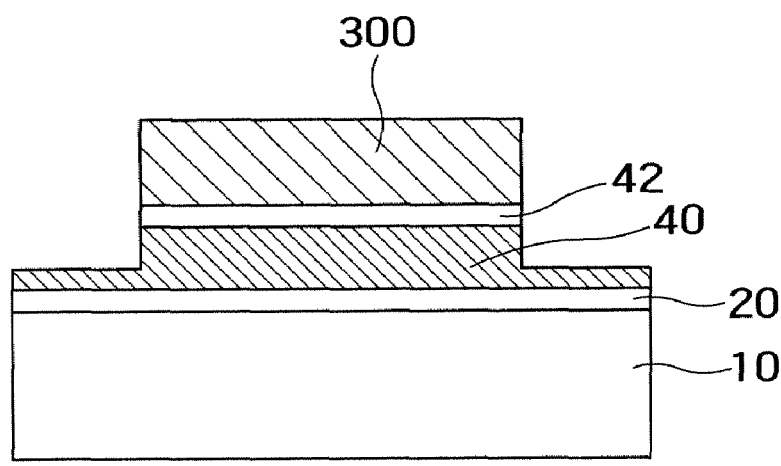

As shown in FIG. 47B, the TEOS film 310 and the silicon nitride film 320 in the logic circuit region are removed by the photolithography and the etching. Thereafter, the SOI layer 40 is removed by an anisotropic etching. An STI trench reaching BOX layer 20 is thereby formed.

Figure 48A:
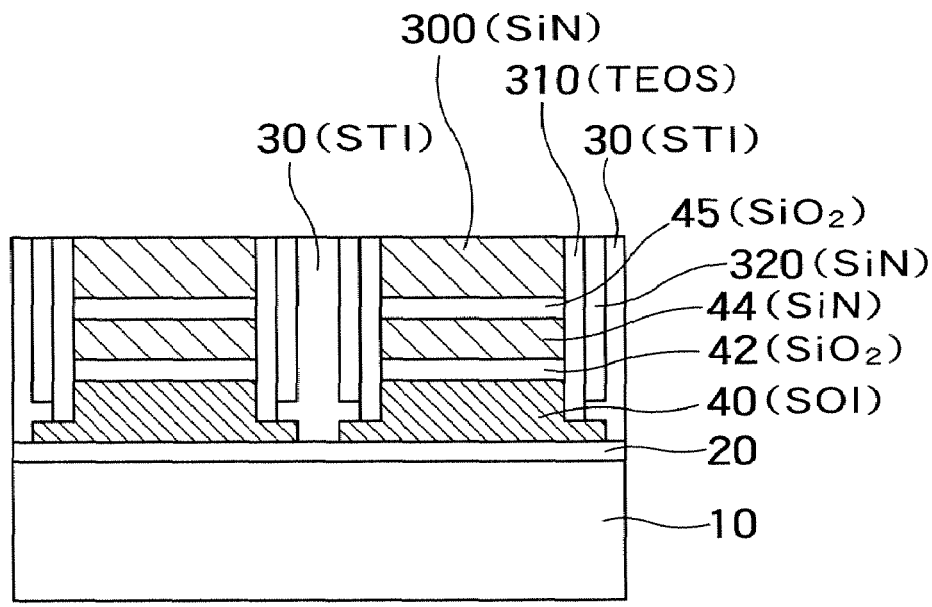
Figure 48B:
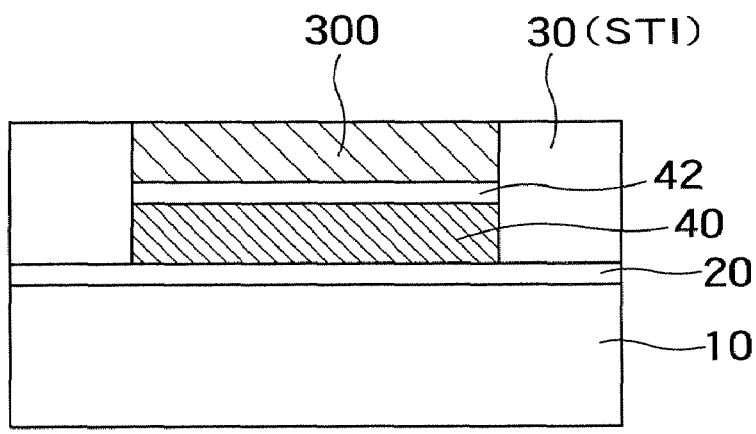

An insulating film such as a silicon oxide film is filled up into the trench in the element isolation region, and flattened by the CMP. As a result, as shown in FIGS. 48A and 48B, the STI region 30 is formed.

Figure 49A:
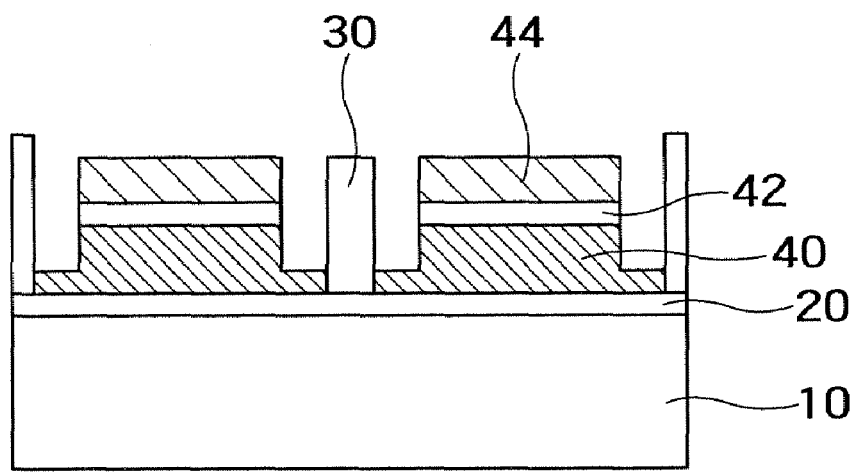
Figure 49B:
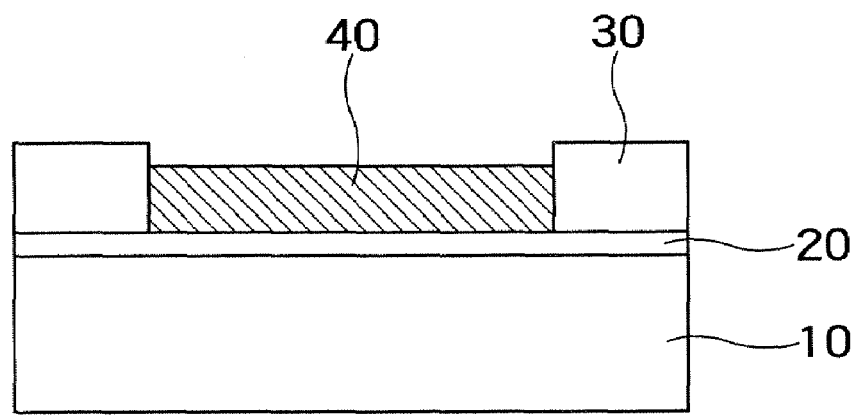

As shown in FIG. 49, the silicon nitride films 300 and 320 are removed by the hot phosphoric acid solution, and the TEOS films 310 in the memory cell and the silicon oxide film 42 in the logic circuit region are removed by a diluted hydrofluoric acid. Impurities are implanted into the SOI layer 40 if it is necessary.

Figure 50:
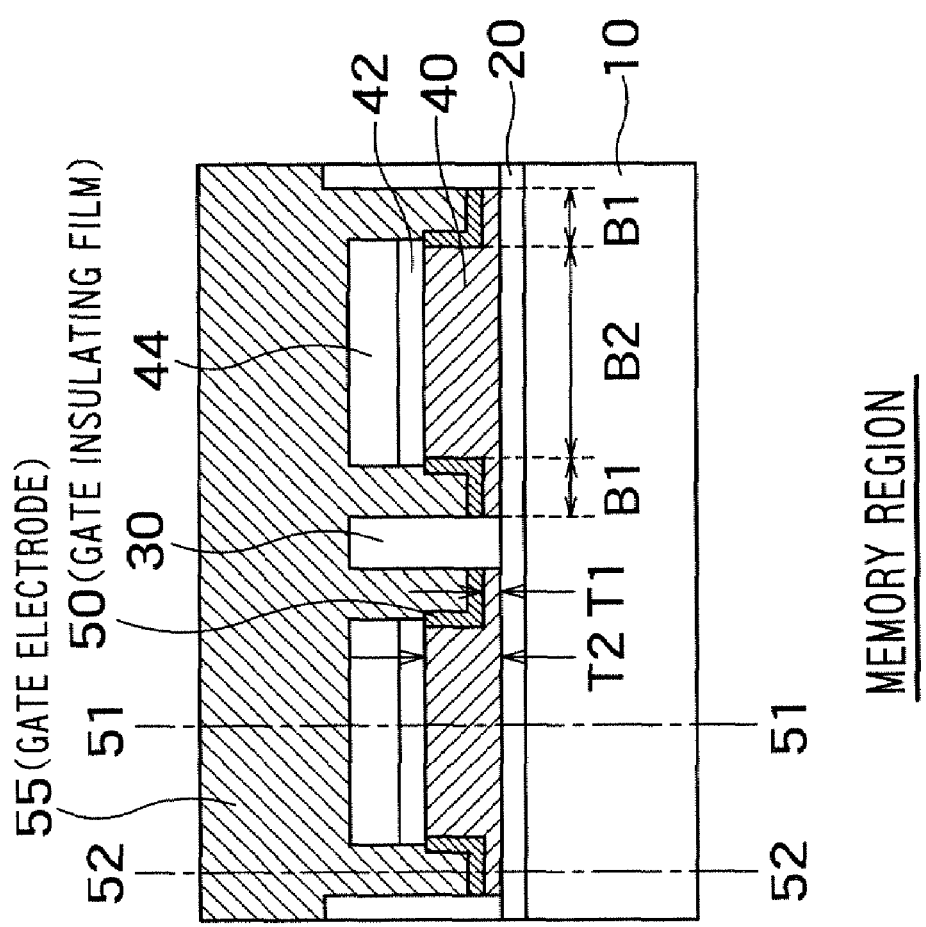

As shown in FIG. 50, the gate insulating film 50 and the gate electrode 55 are formed.

Figure 51:
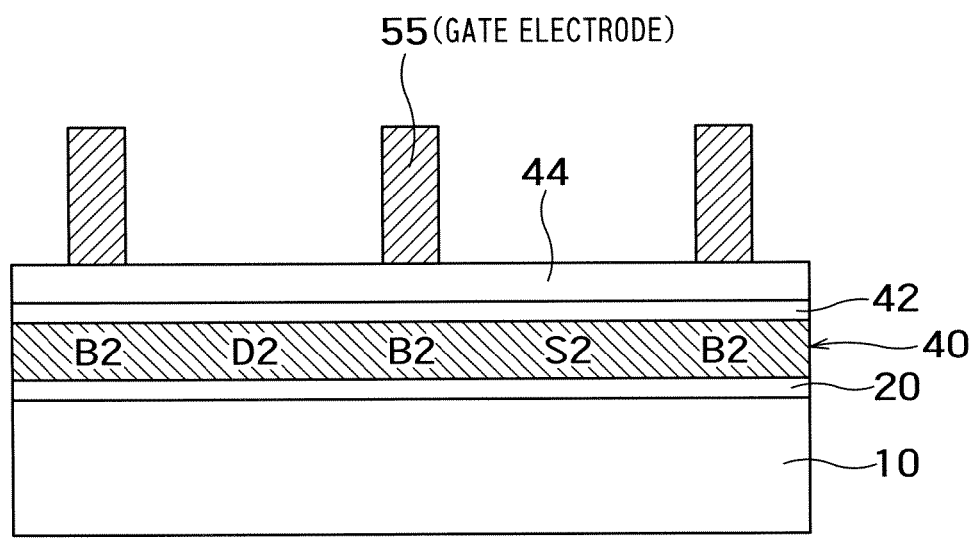
FIG. 51 is a cross-sectional view of the FBC memory device taken along a line 51-51 of FIG. 50.

FIG. 51 is a cross-sectional view of the FBC memory device taken along a line 51-51 of FIG. 50. FIG. 51 shows cross sections of the second body part B2, the second source part S2, and the second drain part D2 cut in the extension direction of the STI region 30 and the SOI layer 40. Therefore, the cross sections of B2, D2, B2, S2, B2, D2, and so on appear in FIG. 50 in that order.

Figure 52:
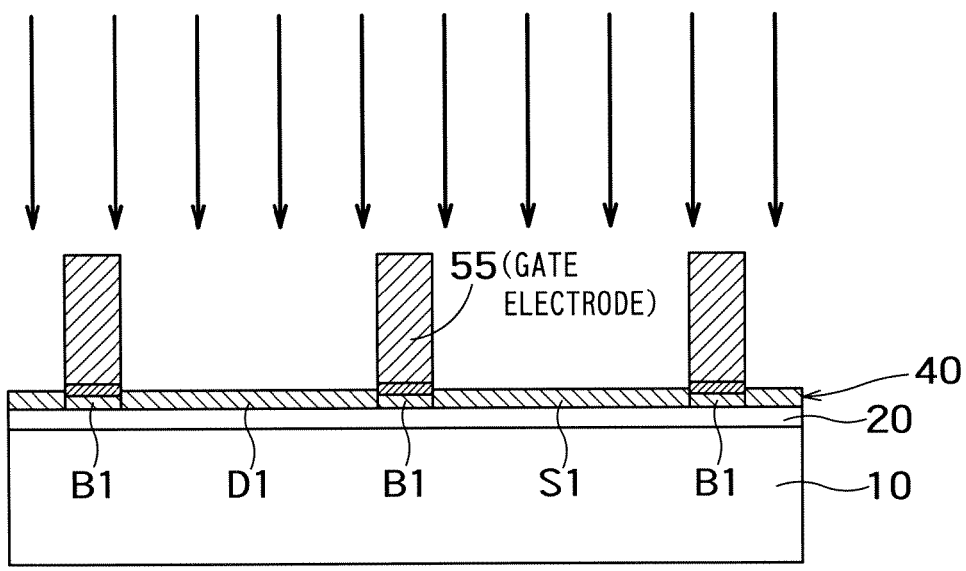
FIG. 52 is a cross-sectional view of the FBC memory device taken along a line 52-52 of FIG. 50.

FIG. 52 is a cross-sectional view of the FBC memory device taken along a line 52-52 of FIG. 50. FIG. 52 shows cross sections of the first body part B1, the first source part S1, and the first drain part D1 in the extension direction of the STI region 30 and the SOI layer 40. Therefore, the cross sections of B1, D1, B1, S1, B1, D1, and so on appear in FIG. 37B in that order.

After forming the gate electrode 55, arsenic or phosphorus ions are implanted, as N-type impurities for formation of a source and a drain, into the source region and the drain region with the gate electrode 55 used as a mask. The arsenic or phosphorus ions are implanted into the source region and the drain region at a dosage of, for example, $1\times10^{13}$ cm$^{-2}$ at an acceleration energy of, for example, 2 keV. The first source part S1 and the first drain part D1 are thereby formed. At this moment, impurities can be implanted into the side surface of the second body part B2 by oblique ion implantation to form a lightly-doped drain (LDD).

Figure 54:
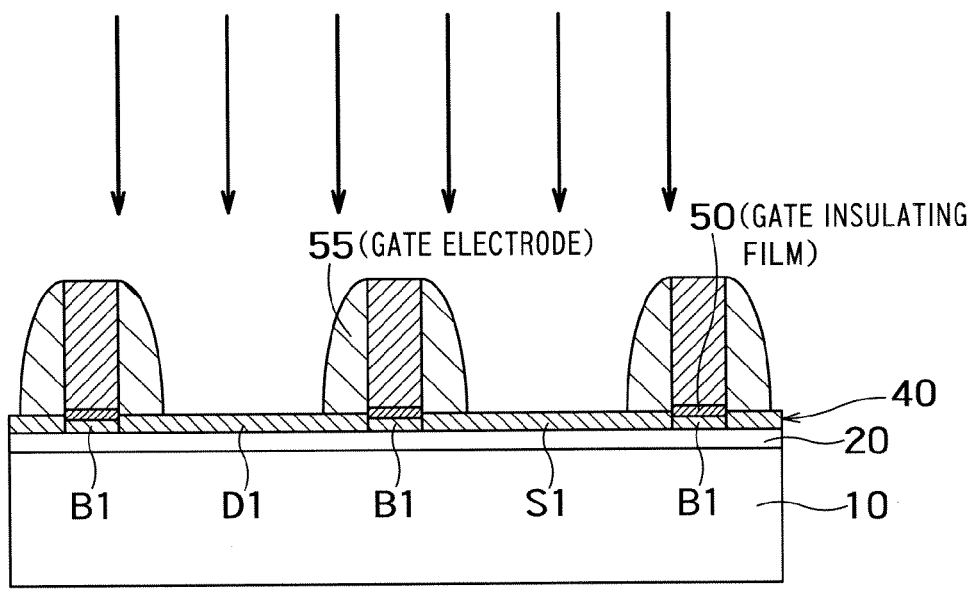
FIG. 54 is a cross-sectional view of the FBC memory device subsequent to FIG. 52.

As shown in FIG. 51, at the ion implantation step, the silicon nitride film 44 covers up, as the first sidewall film, the second source part S2 and the second drain part D2. The thickness of the silicon nitride film 44 is, for example, 50 nm. At the ion implantation step, therefore, no impurities are implanted into the second source part S2 and the second drain part D2. On the other hand, as shown in FIG. 54, the silicon nitride film 44 does not cover up the first source part S1 and the first drain part D1. At the ion implantation step, therefore, the impurities are implanted into the first source part S1 and the first drain part D1. As a result of the ion implantation step, the width L1 of the first body part B1 between the first drain part D1 and the first source part S1 shown in FIG. 39 is determined.

Figure 53:
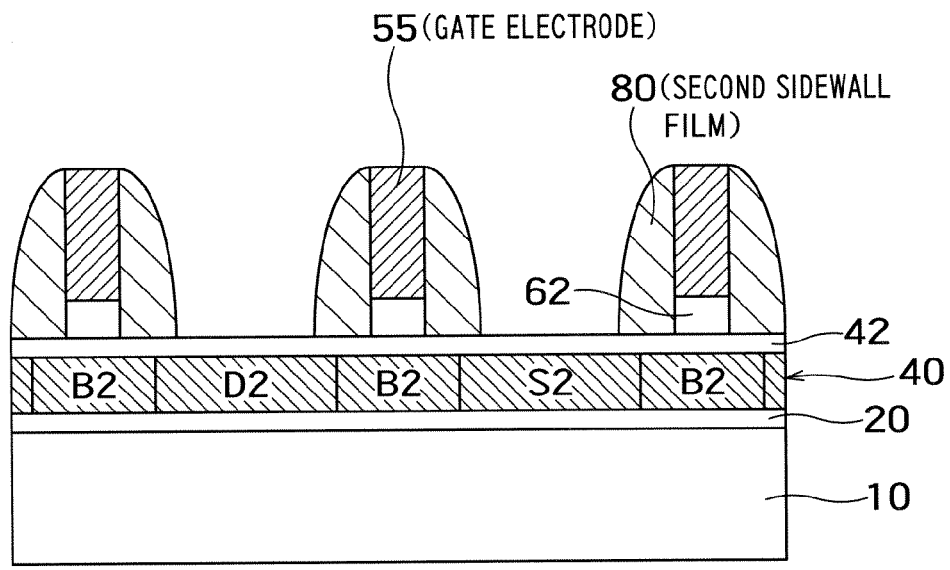
FIG. 53 is a cross-sectional view of the FBC memory device subsequent to FIG. 51.

FIG. 53 is a cross-sectional view of the FBC memory device subsequent to FIG. 51. FIG. 54 is a cross-sectional view of the FBC memory device subsequent to FIG. 52. The silicon nitride film 44 is removed by the hot phosphoric acid solution. As a result, a hollow is formed as the void 62 under the gate electrode 55. Next, an insulating film is deposited on the gate electrode 55, the source region, and the drain region. Next, the deposited insulating film is anisotropically etched by the RIE. Accordingly, as shown in FIGS. 53 and 54, the second sidewall film 80 is formed on the side surface of the gate electrode 55. The second sidewall film 80 is made of, for example, a silicon oxide film or a silicon nitride film.

Using the second sidewall film 80 and the gate electrode 55 as mask materials, arsenic or phosphorus ions are implanted, as N-type impurities, into the source region and the drain region. The arsenic or phosphorus ions are implanted into the source and drain regions at a dosage of, for example, $5\times10^{15}$ cm$^{-2}$ at an acceleration energy of, for example, 2 keV. The second source part S2 and the second drain part D2 are thereby formed. As a result of the implantation step, the width L2 of the second body part B2 between the second drain part D2 and the second source part S2 shown in FIG. 39 is determined.

Thereafter, the silicide layer, the interlayer insulating film, the bit-line contact BLC, the source-line contact SLC, and the like are formed by a conventional process. The FBC memory device according to the fifth embodiment is thus completed.

The invention claimed is:

1. A semiconductor memory device comprising:
    an insulating film;
    a semiconductor layer provided on the insulating film;
    a source layer and a drain layer formed on the semiconductor layer;
    a body region provided between the source layer and the drain layer, the body region being in an electrically floating state, accumulating or emitting charges for storing data, and including a first body part and a second body part respectively provided in contact with the insulating film and being adjacent to each other in a channel width direction, the first body part being smaller than the second body part in a thickness measured in a direction perpendicular to a surface of the insulating film;
    a gate insulating film provided on the first body part and the second body part; and
    a gate electrode provided on the gate insulating film.

2. The semiconductor memory device according to claim 1, wherein
    the source layer includes a first source part and a second source part, the first source part and the second source part respectively provided in contact with the insulating film and being adjacent to each other in a channel width direction, the first source part being smaller than the second source part in a thickness measured in a direction perpendicular to a surface of the insulating film, and
    the drain layer includes a first drain part and a second drain part, the first drain part and the second drain part respectively provided in contact with the insulating film and being adjacent to each other in a channel width direction, the first drain part being smaller than the second drain part in a thickness measured in a direction perpendicular to a surface of the insulating film.

3. The semiconductor memory device according to claim 2, wherein
    the first source part is thinner than the second source part and is made of a silicide in contact with the insulating film, and
    the first drain part is thinner than the second drain part and is made of a silicide in contact with the insulating film.

4. The semiconductor memory device according to claim 3, wherein
    the second source part is a multilayer including the semiconductor layer and a silicide layer formed on the semiconductor layer, and
    the second drain part is a multilayer including the semiconductor layer and the silicide layer formed on the semiconductor layer.

5. The semiconductor memory device according to claim 4, wherein
    the silicide layer is formed on a side surface of the semiconductor layer at a boundary between the first source part and the second source part, and
    the silicide layer is formed on the side surface of the semiconductor layer at a boundary between the first drain part and the second drain part.

6. The semiconductor memory device according to claim 2, wherein
    the second source part is a multilayer including the semiconductor layer and a silicide layer formed on the semiconductor layer, and
    the second drain part is a multilayer including the semiconductor layer and the silicide layer formed on the semiconductor layer.

7. A semiconductor memory device comprising:
    an insulating film;
    a semiconductor layer provided on the insulating film;
    a source layer and a drain layer formed on the semiconductor layer;

a body region provided between the source layer and the drain layer, the body region being in an electrically floating state, accumulating or emitting charges for storing data, and including a first body part and a second body part respectively provided in contact with the insulating film and being adjacent to each other in a channel width direction, the first body part and the second body part differing in width between the source layer and the drain layer;

a gate insulating film provided on the first body part and the second body part; and a gate electrode provided on the gate insulating film.

8. The semiconductor memory device according to claim 7, wherein a part of the gate insulating film on the second body part is thicker than a part of the gate insulating film on the first body part, and the second body part is an end portion of the body region, and the second body part is wider than the first body part in width between the source layer and the drain layer.

9. The semiconductor memory device according to claim 7, wherein the first body part and the second body part are different in a thickness measured in a direction perpendicular to a surface of the insulating film.

10. The semiconductor memory device according to claim 7, wherein the source layer includes a first source part and a second source part, the first source part and the second source part respectively provided in contact with the insulating film and being adjacent to each other in a channel width direction, the first source part being smaller than the second source part in a thickness measured in a direction perpendicular to a surface of the insulating film, and the drain layer includes a first drain part and a second drain part, the first drain part and the second drain part respectively provided in contact with the insulating film and being adjacent to each other in a channel width direction, the first drain part being smaller than the second drain part in a thickness measured in a direction perpendicular to a surface of the insulating film.

11. The semiconductor memory device according to claim 10, wherein the first source part is thinner than the second source part in a thickness measured in a direction perpendicular to a surface of the insulating film and is made of a silicide in contact with the insulating film, and the first drain part is thinner than the second drain part in a thickness measured in a direction perpendicular to a surface of the insulating film and is made of a silicide in contact with the insulating film.

12. The semiconductor memory device according to claim 11, wherein the second source part is a multilayer including the semiconductor layer and a silicide layer formed on the semiconductor layer, and the second drain part is a multilayer including the semiconductor layer and the silicide layer formed on the semiconductor layer.

13. The semiconductor memory device according to claim 12, wherein the silicide layer is formed on a side surface of the semiconductor layer at a boundary between the first source part and the second source part, and the silicide layer is formed on the side surface of the semiconductor layer at a boundary between the first drain part and the second drain part.

14. The semiconductor memory device according to claim 10, wherein the second source part is a multilayer including the semiconductor layer and a silicide layer formed on the semiconductor layer, and the second drain part is a multilayer including the semiconductor layer and the silicide layer formed on the semiconductor layer.

\* \* \* \* \*